US011512213B2

(12) United States Patent
Tan et al.

(10) Patent No.: US 11,512,213 B2
(45) Date of Patent: Nov. 29, 2022

(54) PEROVSKITE POLYMER COMPOSITE

(71) Applicant: National University of Singapore, Singapore (SG)

(72) Inventors: Zhi Kuang Tan, Singapore (SG); Ying-Chieh Wong, Singapore (SG); Jun De Andrew Ng, Singapore (SG); Beiye Li, Singapore (SG)

(73) Assignee: NATIONAL UNIVERSITY OF SINGAPORE, Singapore (SG)

( * ) Notice: Subject to any disclaimer, the term of this patent is extended or adjusted under 35 U.S.C. 154(b) by 7 days.

(21) Appl. No.: 16/980,725

(22) PCT Filed: Mar. 13, 2019

(86) PCT No.: PCT/SG2019/050136
§ 371 (c)(1),
(2) Date: Sep. 14, 2020

(87) PCT Pub. No.: WO2019/177537
PCT Pub. Date: Sep. 19, 2019

(65) Prior Publication Data
US 2021/0024765 A1    Jan. 28, 2021

Related U.S. Application Data

(60) Provisional application No. 62/642,157, filed on Mar. 13, 2018.

(51) Int. Cl.
| | | |
|---|---|---|
| C09D 11/50 | (2014.01) | |
| C01G 21/00 | (2006.01) | |
| C07F 7/24 | (2006.01) | |
| C09D 11/101 | (2014.01) | |
| C09D 11/107 | (2014.01) | |
| C09D 11/108 | (2014.01) | |
| C09K 11/06 | (2006.01) | |
| C09K 11/89 | (2006.01) | |
| H01L 29/00 | (2006.01) | |
| H01L 51/00 | (2006.01) | |
| C09K 11/66 | (2006.01) | |
| C09K 11/02 | (2006.01) | |
| C08K 3/16 | (2006.01) | |
| C08L 25/06 | (2006.01) | |
| H01L 33/50 | (2010.01) | |
| B82Y 30/00 | (2011.01) | |

(52) U.S. Cl.
CPC ............ C09D 11/50 (2013.01); C01G 21/006 (2013.01); C07F 7/24 (2013.01); C08K 3/16 (2013.01); C08L 25/06 (2013.01); C09D 11/101 (2013.01); C09D 11/107 (2013.01); C09D 11/108 (2013.01); C09K 11/02 (2013.01); C09K 11/06 (2013.01); C09K 11/664 (2013.01); C09K 11/665 (2013.01); C09K 11/897 (2013.01); H01L 29/00 (2013.01); H01L 51/0077 (2013.01); B82Y 30/00 (2013.01); C01P 2002/34 (2013.01); C01P 2004/50 (2013.01); C01P 2004/64 (2013.01); H01L 33/502 (2013.01)

(58) Field of Classification Search
CPC ..... C09K 11/02; C09K 11/664; C09K 11/665; B81Y 30/00
See application file for complete search history.

(56) References Cited

U.S. PATENT DOCUMENTS

| | | | |
|---|---|---|---|
| 6,350,946 B1 | 2/2002 | Miyake et al. | |
| 6,849,702 B2 | 2/2005 | Callahan et al. | |
| 11,124,702 B2 | 9/2021 | Min et al. | |
| 2015/0307666 A1 | 10/2015 | Kodas et al. | |
| 2017/0121598 A1 | 5/2017 | Min et al. | |
| 2018/0010039 A1* | 1/2018 | Dong | C08K 5/56 |

FOREIGN PATENT DOCUMENTS

| | | |
|---|---|---|
| CN | 107022354 A | 8/2017 |
| CN | 107142100 A | 9/2017 |
| CN | 109326672 A | 2/2019 |
| WO | 2016027450 A1 | 2/2016 |
| WO | 2016083783 A1 | 6/2016 |

(Continued)

OTHER PUBLICATIONS

Yao, Kai et al. "A general fabrication procedure for efficient and stable planar perovskite solar cells: Morphological and interfacial control by in-situ-generated layered perovskite" Nano Energy 2015, 18, 165-175 (11 pages).
Zhang, Haihua et al. "Embedding Perovskite Nanocrystals into a Polymer Matrix for Tunable Luminescence Probes in Cell Imaging" Adv. Funct. Mater. 2017, 27, 1604382 (8 pages).
Xi, Life et al. "Facile in situ synthesis of stable luminescent organic-inorganic lead halide perovskite nanoparticles in a polymer matrix" J Mater. Chem. C 2017, 5, 7207-7214 (8 pages).

(Continued)

Primary Examiner — C Melissa Koslow
(74) Attorney, Agent, or Firm — Osha Bergman Watanabe & Burton LLP

(57) ABSTRACT

Disclosed herein is a polymeric film, the film comprising a polymeric matrix material, a plurality of perovskite nanocrystals and/or aggregates of perovskite nanocrystals dispersed throughout the polymeric matrix material. There is also disclosed a perovskite polymer resin composition, a perovskite-polymer resin composition, a perovskite ink and a method of forming a luminescent film using any one of the compositions or ink. Preferably, the perovskite material is a lead halide perovskite containing a cation selected from Cs, an alkylammonium ion, or a formamidinium ion. The polymeric matrix is preferably formed from monomers comprising a vinyl or an acrylate group.

7 Claims, 8 Drawing Sheets

(56) References Cited

FOREIGN PATENT DOCUMENTS

| WO | 2016109902 | A2 | | 7/2016 |
|---|---|---|---|---|
| WO | 2017020137 | A1 | † | 2/2017 |
| WO | 2017121984 | A1 | | 7/2017 |
| WO | 2018028870 | A1 | † | 2/2018 |

OTHER PUBLICATIONS

Chen, Kun et al. "Photocatalytic Polymerization of 3,4-Ethylenedioxythiophene over Cesium Lead Iodide Perovskite Quantum Dots" J. Am. Chem. Soc. 2017, 139, 12267?12273 (7 pages).
Akbarian-Tefaghi, S., Wiley, J., Conference Paper, American Chemical Society National Meeting and Exposition (1 page), Aug. 2016.
Wang, Yanan et al., "Ultrastable, Highly Luminescent Organic-Inorganic Perovskite-Polymer Composite Films", Advanced Materials, Material Views, Wiley-VCH Verlag GmbH & Co. KGaA, vol. 28, 2016, pp. 10710-10717 (8 pages).
Li, Guangru et al., "Efficient Light-Emitting Diodes Based on Nanocrystalline Perovskite in a Dielectric Polymer Matrix", Nano Letters, ACS Publications, American Chemical Society, vol. 15, Feb. 2015, pp. 2640-2644 (5 pages).
Tsegay, Nigus Mesele et al., "Infrared laser-ignited horizontal frontal polymerization of versatile unsaturated polyester resins", Journal of Applied Polymer Science, Advanced Science News, Wiley Periodicals, Inc., No. 45935, 2018, pp. 1-10 (10 pages).
Sun, Haizhu et al., "Chemically Addressable Perovskite Nanocrystals for Light-Emitting Applications", Advanced Materials, Wiley-VCH Veriag GmbH & Co. KGaA, vol. 29, No. 1701153, 2017, pp. 1-9 (9 pages).
Wong, Ying-Chieh et al., "Perovskite-Initiated Photopolymerization for Singly Dispersed Luminescent Nanocomposites", Advanced Materials, Wiley-VCH Verlag GmbH & Co. KGaA, vol. 30, No. 1800774, 2018, pp. 1-6 (6 pages).
International Search Report issued in corresponding International Application No. PCT/SG2019/050136, dated May 29, 2019 (6 pages).
Written Opinion issued in corresponding International Application No. PCT/SG2019/050136, dated May 29, 2019 (9 pages).
Hiemenz, Paul C. and Timothy P. Lodge, "Chain Growth Polymerization", Polymer Chemistry, CRC Press, Second Ed., 2007, pp. 77-115 (39 pages).
Protesescu, Loredana et al., "Nanocrystals of Cesium Lead Halide Perovskites (CsPbX3, X = Cl, Br, and I): Novel Optoelectronic Materials Showing Bright Emission with Wide Color Gamut", Nano Letters, ACS Publications, American Chemical Society, vol. 15, Jan. 2015, pp. 3692-3696 (5 pages).
Zhou, Qingchao et al., "In Situ Fabrication of Halide Perovskite Nanocrystal-Embedded Polymer Composite Films with Enhanced Photoluminescence for Display Backlights", Advanced Materials, Wiley-VCH Verlag GmbH & Co. KGaA, vol. 28, 2016, pp. 9163-9168 (6 pages).

Raja, Shilpa N. et al., "Encapsulation of Perovskite Nanocrystals into Macroscale Polymer Matrices: Enhanced Stability and Polarization", Applied Materials & Interfaces, ACS Publications, American Chemical Society, vol. 8, Dec. 2016, pp. 35523-35533 (11 pages).
Bade, Sri Ganesh R. et al., "Stretchable Light-Emitting Diodes with Organometal-Halide-Perovskite-Polymer Composite Emitters", Advanced Materials, Wiley-VCH Verlag GmbH & Co. KGaA, vol. 29, No. 1607053, 2017, pp. 1-7 (7 pages).
Kagan, C.R. et al., "Electronic Energy Transfer in CdSe Quantum Dot Solid", Physical Review Letters, The American Physical Society, vol. 76, No. 9, Feb. 1996, pp. 1517-1520 (4 pages).
Tan, Zhi-Kuang et al., "Bright light-emitting diodes based on organometal halide perovskite", Nature Nanotechnology, Macmillan Publishers Limited, vol. 9, Aug. 2014, pp. 687-692 (6 pages).
Cho, Himchan et al., "Overcoming the electroluminescence efficiency limitations of perovskite light-emitting diodes", Science, sciencemag.org, vol. 350, Issue 6265, Dec. 2015, pp. 1222-1225 (4 pages).
Wang, Jianpu et al., "Interfacial Control Toward Effi cient and Low-Voltage Perovskite Light-Emitting Diodes", Advanced Materials, Wiley-VCH Verlag GmbH & Co. KGaA, vol. 27, 2015, pp. 2311-2316 (6 pages).
Song, Jizhong et al., "Quantum Dot Light-Emitting Diodes Based on Inorganic Perovskite Cesium Lead Halides (CsPbX3)", Advanced Materials, Wiley-VCH Verlag GmbH & Co. KGaA, vol. 27, 2015, pp. 7162-7167 (6 pages).
Li, Guangru et al., "Highly Efficient Perovskite Nanocrystal Light-Emitting Diodes Enabled by a Universal Crosslinking Method", Advanced Materials, Wiley-VCH Verlag GmbH & Co. KGaA, vol. 28, 2016, pp. 3528-3534 (7 pages).
Yuan, Mingjian et al., "Perovskite energy funnels for efficient light-emitting diodes", Nature Nanotechnology, Macmillan Publishers Limited, vol. 11, Jun. 2016, pp. 872-877 (8 pages).
Wang, Nana et al., "Perovskite light-emitting diodes based on solutionprocessed self-organized multiple quantum wells", Nature Photonics, Macmillan Publishers Limited, vol. 10, Sep. 2016, pp. 699-704 (6 pages).
Xiao, Zhengguo et al., "Efficient perovskite light-emitting diodes featuring nanometre-sized crystallites", Nature Photonics, Macmillan Publishers Limited, vol. 11, Jan. 2017, pp. 108-115 (8 pages).
Office Action issued in corresponding TW Application No. 108108482 dated Aug. 17, 2022 (20 pages).
Office Action issued in corresponding CN Application No. 201980018884.4 dated Aug. 16, 2022 (9 pages).
Permabond UV681 MSDS, Mar. 29, 2016.†
Yanan Wang et al., "Ultrastable, Highly Luminescent Organic-Inorganic Perovkite-Polymer Composite Films", Adv. Mater. 2016.†

\* cited by examiner
† cited by third party

PEROVSKITE POLYMER COMPOSITE

FIELD OF INVENTION

The current invention relates to a perovskite-polymer composite film material, intermediates thereof and methods of manufacturing said film. The film may have optoelectronic applications.

BACKGROUND

The listing or discussion of a prior-published document in this specification should not necessarily be taken as an acknowledgement that the document is part of the state of the art or is common general knowledge.

Metal halide perovskites have demonstrated rich photophysics and remarkable potential in photovoltaic and electroluminescent devices. In particular, lead halide perovskite semiconductors show beneficial properties such as a narrow emission linewidth and an optical bandgap that could be easily tuned to emit across the entire visible spectrum. These properties allow perovskites to offer excellent colour reproduction in electroluminescent devices and photoluminescent down-conversion displays. While further development is required to improve the operational stability of perovskites in electroluminescent devices, perovskite's better tolerance to photo-excitation makes their near-term utility in photoluminescent down-conversion displays possible.

Conventionally, the fabrication of a down-conversion film involves the blending of pre-formed perovskites or their precursors with a transparent polymer, where the polymer served as a protective encapsulating matrix (G. Li, et al., *Nano Letters* 2015, 15, 2640; M. V. Kovalenko, et al., *Nano Letters* 2015, 15, 3692; Q. Zhou, et al., *Advanced Materials* 2016, 28, 9163; Y. Wang, et al., *Advanced Materials* 2016, 28, 10710; S. N. Raja, et al., *ACS Applied Materials & Interfaces* 2016, 8, 35523; and S. G. R. Bade, et al., *Advanced Materials* 2017, 29, 1607053). However, the control of perovskite-polymer phase separation dynamics is typically challenging, and the conventional approach could result in the formation of inhomogeneous films with large perovskite or polymer aggregates. There is therefore a need for an improved process for fabricating a perovskite-polymer composite.

SUMMARY OF INVENTION

Aspects and embodiments of the invention are disclosed in the following numbered clauses.

1. A polymeric film comprising:
   a polymeric matrix material;
   a plurality of perovskite nanocrystals and/or aggregates of perovskite nanocrystals dispersed throughout the polymeric matrix material, the perovskite material of the nanocrystals and/or aggregates having formula I:

 $APbX_3$  I, wherein:
   X is a halogen anion selected from one or more of Br, Cl, I;
   A is a monovalent cation selected from one or more of Cs, an alkylammonium ion, and a formamidinium ion; and
   each perovskite nanocrystal and/or aggregate of perovskite nanocrystals is separated from each other perovskite nanocrystal and/or aggregate of perovskite nanocrystals by an average distance of greater than or equal to 20 nm.

2. The film according to Clause 1, wherein the polymeric matrix material is formed from monomers comprising a vinyl group, optionally wherein the monomers comprising a vinyl group are a styrene and/or an acrylate ester (e.g. one or more of methyl methacrylate, lauryl methacrylate and isobornyl acrylate).

3. The film according to Clause 2, wherein the polymeric matrix material further comprises crosslinking groups.

4. The film according to Clause 3, wherein the crosslinking groups are derived from a crosslinking agent comprising from two to five, such as from two to three, vinyl groups, optionally wherein the crosslinking groups are derived from one or more of the group selected from poly(propylene glycol) diacrylate, bisphenol A diacrylate, bisphenol A diethoxylate diacrylate, trimethylolpropane triacrylate, neopentyl glycol propoxylate diacrylate, neopentyl glycol diacrylate, urethane diacrylate and tricycle[5.2.1.0] decanedimethanol diacrylate.

5. The film according to any one of the preceding clauses, wherein the film comprises:
   (a) from 0.05 to 50 wt % of the plurality of perovskite particles and/or perovskite aggregates and from 50 to 99.95 wt % of the polymeric matrix material; and/or
   (b) a weight to weight ratio of perovskite particles to polymeric matrix material of from 0.0002:1 to 1:1, such as from 0.0005:1 to 0.5:1, such as from 0.001:1 to 0.1:1, such as from 0.1:1 to 1:1.

6. The film according to Clause 5, wherein:
   (a) the plurality of perovskite particles and/or perovskite aggregates are present in an amount of from 0.05 to 1 wt % of the entire weight of the film or from 30 to 50 wt % of the entire weight of the film; and/or
   (b) the plurality of perovskite particles and/or perovskite aggregates are present in a weight to weight ratio of from 0.0002:1 to 0.01:1 or from 0.1:1 to 1:1 relative to the weight of the polymeric matrix material.

7. The film according to any one of the preceding clauses, where:
   each nanocrystal has a length of from 2 to 100 nm, such as from 5 to 50 nm, such as from 10 to 20 nm; and/or
   each aggregate of perovskite nanocrystals has a diameter of from 50 to 5,000 nm, such as from 100 to 1,000 nm; and/or
   each perovskite nanocrystal and/or aggregate of perovskite nanocrystals is separated from
   each other perovskite nanocrystal and/or aggregate of perovskite nanocrystals by an average distance of from 20 to 2000 nm, such as from 50 to 500 nm, such as from 100 to 200 nm.

8. The film according to any one of Clauses 3 to 7 wherein the crosslinked polymeric matrix material comprises a wt:wt ratio of monomeric repeating units to crosslinking units of from 0.02:1 to 50:1, such as from 0.1:1 to 10:1, such as from 0.2:1 to 5:1, such as from 0.5:1 to 2:1.

9. A perovskite polymer resin composition comprising:
   perovskite nanocrystals and/or aggregates of perovskite nanocrystals, the perovskite material of the nanocrystals and/or aggregates having formula I:

 $APbX_3$  I, a polymerisation mixture, comprising a monomer and optionally one or more of oligomers and polymers derived from the monomer;
   a crosslinking agent; and
   optionally, a photoinitiator, wherein:
   X is a halogen anion selected from one or more of Br, Cl, I;

A is a monovalent cation selected from one or more of Cs, an alkylammonium ion, and a formamidinium ion.

10. The resin according to Clause 9, wherein the polymerisation mixture comprises a monomer comprising a vinyl group and the optional oligomers and/or polymers are derived from said monomer, optionally wherein the monomer comprising a vinyl group is a styrene and/or an acrylate (e.g. one or more of methyl methacrylate, lauryl methacrylate and isobornyl acrylate).

11. The resin according to Clause 10, wherein the crosslinking agent comprises from two to five, such as from two to three, vinyl groups, optionally wherein the crosslinking groups are derived from one or more of the group selected from poly(propylene glycol) diacrylate, bisphenol A diacrylate, bisphenol A diethoxylate diacrylate, trimethylolpropane triacrylate, neopentyl glycol propoxylate diacrylate, neopentyl glycol diacrylate, urethane diacrylate and tricycle[5.2.1.0]decanedimethanol diacrylate.

12. The resin according to any one of Clauses 9 to 11, wherein the resin is selected from one comprising:
(a) from 0.05 to 50 wt % of the perovskite nanocrystals and/or aggregates of perovskite nanocrystals;
from 2 to 99.95 wt % of the polymerisation mixture;
from 2 to 99.95 wt % of the crosslinking agent; and
from 0 to 2.5 wt % of the photoinitiator,
(b) from 0.1 to 50 wt % of the perovskite nanocrystals and/or aggregates of perovskite nanocrystals;
from 40 to 70 wt % of the polymerisation mixture;
from 10 to 45 wt % of the crosslinking agent; and
from 0 to 2.5 wt % of the photoinitiator;
(c) from 0.1 to 1 wt % of the perovskite nanocrystals and/or aggregates of perovskite nanocrystals;
from 55 to 70 wt % of the polymerisation mixture;
from 25 to 45 wt % of the crosslinking agent; and
from 0 to 2.5 wt % of the photoinitiator; or
(d) from 30 to 50 wt % of the perovskite nanocrystals and/or aggregates of perovskite nanocrystals;
from 20 to 50 wt % of the polymerisation mixture;
from 20 to 40 wt % of the crosslinking agent; and
from 0 to 2.5 wt % of the photoinitiator.

13. The resin according to any one of Clauses 9 to 12, wherein:
(a) the weight to weight ratio of the perovskite nanocrystals and/or aggregates of perovskite nanocrystals to the sum of the weights of the polymerisation mixture and crosslinking agent is from 0.0002:1 to 1:1, such as from 0.0005:1 to 0.5:1, such as from 0.001:1 to 0.1:1, such as from 0.1:1 to 1:1; and/or
(b) the weight to weight ratio of the photoinitiator to the sum of the weights of the polymerisation mixture and crosslinking agent is from 0.001:1 to 0.03:1.

14. The resin according to any one of Clauses 9 to 13, where:
each nanocrystal has a length of from 2 to 100 nm, such as from 5 to 50 nm, such as from 10 to 20 nm; and/or
each aggregate of perovskite nanocrystals has a diameter of from 50 to 5,000 nm, such as from 100 to 1,000 nm.

15. The resin according to any one of Clauses 9 to 14 wherein a wt:wt ratio of the polymerisation mixture to the crosslinking agent is from 0.02:1 to 50:1, such as from 0.1:1 to 10:1, such as from 0.2:1 to 5:1, such as from 0.5:1 to 2:1.

16. A perovskite-polymer resin composition comprising:
a perovskite-polymer composite material comprising:
perovskite nanocrystals and/or aggregates of perovskite nanocrystals, the perovskite material of the nanocrystals and/or aggregates having formula I:

$$APbX_3 \qquad I; \text{ and}$$

a polymer shell material surrounding each perovskite nanocrystals and/or aggregates of perovskite nanocrystals;
a crosslinking agent;
a photoinitiator; and
optionally, a polymerisation mixture comprising a monomer and optionally one or more of oligomers and polymers derived from the monomer, wherein:
X is a halogen anion selected from one or more of Br, Cl, I;
A is a monovalent cation selected from one or more of Cs, an alkylammonium ion, and a formamidinium ion.

17. The composition according to Clause 16, wherein the polymer shell material is formed from monomers comprising a vinyl group.

18. The composition according to Clause 16 or Clause 17, wherein the monomers comprising a vinyl group are a styrene and/or an acrylate (e.g. one or more of methyl methacrylate, lauryl methacrylate and isobornyl acrylate).

19. The composition according to Clause 17 or Clause 18, wherein the crosslinking agent comprises from two to five, such as from two to three, vinyl groups, optionally wherein the crosslinking groups are derived from one or more of the group selected from poly(propylene glycol) diacrylate, bisphenol A diacrylate, bisphenol A diethoxylate diacrylate, trimethylolpropane triacrylate, neopentyl glycol propoxylate diacrylate, neopentyl glycol diacrylate, urethane diacrylate and tricycle[5.2.1.0]decanedimethanol diacrylate.

20. The composition according to any one of Clauses 16 to 19, wherein the composition is selected from one comprising:
(a) from 0.05 to 50 wt % of the perovskite nanocrystals and/or aggregates of perovskite nanocrystals;
from 2 to 99.95 wt % of the polymer shell material;
from 2 to 99.95 wt % of the crosslinking agent;
from 0 to 2.5 wt % of the photoinitiator,
(b) from 0.1 to 50 wt % of the perovskite nanocrystals and/or aggregates of perovskite nanocrystals;
from 40 to 70 wt % of the polymer shell material;
from 10 to 45 wt % of the crosslinking agent; and
from 0 to 2.5 wt % of the photoinitiator
(c) from 0.1 to 1 wt % of the perovskite nanocrystals and/or aggregates of perovskite nanocrystals;
from 55 to 70 wt % of the polymer shell material;
from 25 to 45 wt % of the crosslinking agent; and
from 0 to 2.5 wt % of the photoinitiator; or
(d) from 30 to 50 wt % of the perovskite nanocrystals and/or aggregates of perovskite nanocrystals;
from 20 to 50 wt % of the polymer shell material;
from 20 to 40 wt % of the crosslinking agent; and
from 0 to 2.5 wt % of the photoinitiator.

21. The composition according to Clauses 16 to 20, wherein:
(a) the weight to weight ratio of the perovskite nanocrystals and/or aggregates of perovskite nanocrystals to the sum of the weights of the polymeric shell material and crosslinking agent is from 0.0002:1 to 1:1, such as from 0.0005:1 to 0.5:1, such as from 0.001:1 to 0.1:1, such as from 0.1:1 to 1:1; and/or
(b) the weight to weight ratio of the photoinitiator to the sum of the weights of the polymeric shell material and crosslinking agent is from 0.001:1 to 0.03:1.

22. The composition according to any one of Clauses 16 to 21, where:
each nanocrystal has a length of from 2 to 100 nm, such as from 5 to 50 nm, such as from 10 to 20 nm; and/or
each aggregate of perovskite nanocrystals has a diameter of from 50 to 5,000 nm, such as from 100 to 1,000 nm.

23. The composition according to any one of Clauses 16 to 22 wherein a wt:wt ratio of the polymer shell material to the crosslinking agent is from 0.02:1 to 50:1, such as from 0.1:1 to 10:1, such as from 0.2:1 to 5:1, such as from 0.5:1 to 2:1.

24. A perovskite ink, comprising:
perovskite nanocrystals and/or aggregates of perovskite nanocrystals dispersed throughout the polymeric matrix material, the perovskite material of the nanocrystals and/or aggregates having formula I:

$$APbX_3 \qquad \text{I; and}$$

a vinyl monomer, wherein:
X is a halogen anion selected from one or more of Br, Cl, I;
A is a monovalent cation selected from one or more of Cs, an alkylammonium ion, and a formamidinium ion.

25. The ink according to Clause 24, wherein the vinyl monomer is a styrene and/or an acrylate ester (e.g. one or more of methyl methacrylate, lauryl methacrylate and isobornyl acrylate).

26. The ink according to Clause 24 or Clause 25, wherein the composition further comprises a crosslinking agent and/or a photoinitiator.

27. The ink according to Clause 26, wherein the crosslinking agent comprises from two to five, such as from two to three, vinyl groups, optionally wherein the crosslinking groups are derived from one or more of the group selected from poly(propylene glycol) diacrylate, bisphenol A diacrylate, bisphenol A diethoxylate diacrylate, trimethylolpropane triacrylate, neopentyl glycol propoxylate diacrylate, neopentyl glycol diacrylate, urethane diacrylate and tricycle[5.2.1.0]decanedimethanol diacrylate.

28. The ink according to Clause 26 or Clause 27, wherein the ink is selected from one comprising:
(a) from 0.05 to 50 wt % of the perovskite nanocrystals and/or aggregates of perovskite nanocrystals;
from 2 to 99.95 wt % of the vinyl monomer;
from 2 to 99.95 wt % of the crosslinking agent; and
from 0 to 2.5 wt % of the photoinitiator,
(b) from 0.1 to 50 wt % of the perovskite nanocrystals and/or aggregates of perovskite nanocrystals;
from 40 to 70 wt % of the vinyl monomer;
from 10 to 45 wt % of the crosslinking agent; and
from 0 to 2.5 wt % of the photoinitiator;
(c) from 0.1 to 1 wt % of the perovskite nanocrystals and/or aggregates of perovskite nanocrystals;
from 55 to 70 wt % of the vinyl monomer;
from 25 to 45 wt % of the crosslinking agent; and
from 0 to 2.5 wt % of the photoinitiator; or
(d) from 30 to 50 wt % of the perovskite nanocrystals and/or aggregates of perovskite nanocrystals;
from 20 to 50 wt % of the vinyl monomer;
from 20 to 40 wt % of the crosslinking agent; and
from 0 to 2.5 wt % of the photoinitiator.

29. The ink according to any one of Clauses 24 to 28, wherein:
(a) the weight to weight ratio of the perovskite nanocrystals and/or aggregates of perovskite nanocrystals to the sum of the weights of the vinyl monomer and, where present, crosslinking agent is from 0.0002:1 to 1:1, such as from 0.0005:1 to 0.5:1, such as from 0.001:1 to 0.1:1, such as from 0.1:1 to 1:1; and/or
(b) the weight to weight ratio of the photoinitiator to the sum of the weights of the vinyl monomer and, where present, crosslinking agent is from 0.001:1 to 0.03:1.

30. The ink according to any one of Clauses 24 to 29, wherein:
each nanocrystal has a length of from 2 to 100 nm, such as from 5 to 50 nm, such as from 10 to 20 nm; and/or
each aggregate of perovskite nanocrystals has a diameter of from 50 to 5,000 nm, such as from 100 to 1,000 nm.

31. The ink according to any one of Clauses 24 to 30 wherein a wt:wt ratio of the non-crosslinked polymeric material to the crosslinking agent is from 0.02:1 to 50:1, such as from 0.1:1 to 10:1, such as from 0.2:1 to 5:1, such as from 0.5:1 to 2:1.

32. A method of fabricating a luminescent film, comprising the steps of:
(a) coating a perovskite polymer resin according to any one of Clauses 9 to 15, a perovskite polymer composition according to any one of Clauses 16 to 24, or a perovskite ink according to any one of Clauses 25 to 31 onto a transparent substrate material (e.g. a transparent polymer or glass substrate) to form a coated substrate; and
(b) exposing the coated substrate to light to promote polymerization and/or curing.

33. The method according to Clause 32, wherein the coating technique is selected from one of inkjet printing, offset printing, relief printing, flexography, intaglio printing, gravure printing, and screen printing.

BRIEF DESCRIPTION OF DRAWINGS

Certain embodiments of the present disclosure are described more fully hereinafter with reference to the accompanying drawings.

DESCRIPTION

Figure 1:
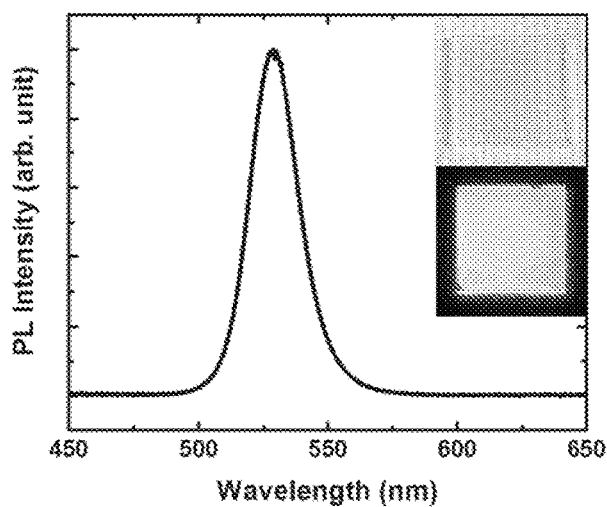
FIG. 1 depicts a photoluminescence (PL) spectrum and inset images of a CsPbBr$_3$ perovskite-polystyrene nanocomposite film prepared after a 14-hour photo-polymerisation reaction.

It has been surprisingly found that a polymeric film that is formed by the combination of a polymeric matrix material and perovskites is particularly suited for use in optoelectronic products, such as electroluminescent devices and down-conversion displays, amongst other potential applications known to people working in the field. Thus, in a first aspect of the invention, there is provided a polymeric film comprising:
a polymeric matrix material;
a plurality of perovskite nanocrystals and/or aggregates of perovskite nanocrystals dispersed throughout the polymeric matrix material, the perovskite material of the nanocrystals and/or aggregates having formula I:

APbX$_3$  I, wherein:
X is a halogen anion selected from one or more of Br, Cl, I;
A is a monovalent cation selected from one or more of Cs, an alkylammonium ion, and a formamidinium ion; and
each perovskite nanocrystal and/or aggregate of perovskite nanocrystals is separated from each other perovskite nanocrystal and/or aggregate of perovskite nanocrystals by an average distance of greater than or equal to 20 nm.

In embodiments herein, the word "comprising" may be interpreted as requiring the features mentioned, but not limiting the presence of other features. Alternatively, the word "comprising" may also relate to the situation where only the components/features listed are intended to be present (e.g. the word "comprising" may be replaced by the phrases "consists of" or "consists essentially of"). It is explicitly contemplated that both the broader and narrower interpretations can be applied to all aspects and embodiments of the present invention. In other words, the word "comprising" and synonyms thereof may be replaced by the phrase "consisting of" or the phrase "consists essentially of" or synonyms thereof and vice versa.

A characteristic feature of the films of the current invention is that each perovskite nanocrystal and/or aggregate of perovskite nanocrystals is separated from each other perovskite nanocrystal and/or aggregate of perovskite nanocrystals by an average distance of from 20 nm. Without wishing to be bound by theory, it is believed that this separation distance is obtained by the participation of the perovskite crystals (whether in single-crystal or aggregate form) as a photoinitiator in the polymerisation or crosslinking/curing of the polymeric matrix material. This photoinitiating effect may then result in the production of chemical bonding between the perovskite nanocrystals and the resulting polymeric matrix material. In addition, it is believed that the participation of the perovskite nanocrystals in the chemical reactions used to manufacture the polymeric matrix material may help generate better luminescence and/or quantum efficiencies in the resulting films. It is also believed that the films of the current invention have superior stability under a wide range of ambient conditions compared to other films made using conventional solvent-casting techniques.

When used herein, the term "polymeric film" is intended to a thin, flexible material made from a polymeric matrix material that also contains the perovskite nanocrystals and/or aggregates of perovskite nanocrystals. For the avoidance of doubt, as long as the polymeric film contains at least one section that contains perovskite nanocrystals and/or aggregates of perovskite nanocrystals dispersed within the polymeric matrix as described herein, then the entire film forms part of the current invention. More normally, the perovskite nanocrystals and/or aggregates of perovskite nanocrystals are distributed throughout the entirety of the film material in question.

When described herein, the term "film" is intended to refer to a thin layer of material that has a thickness of from 10 to 1,000 µm, such as from 50 to 200 µm, such as 100 µm. For the avoidance of doubt, when multiple numerical ranges are provided in relation to a feature of the current invention, it is explicitly contemplated that the disclosed numerical values can be combined in any way possible to generate further numerical ranges in relation to that feature. As an example, the values above are explicitly intended to disclose the following ranges: 10 to 50 µm, 10 to 100 µm, 10 to 200 µm and 10 to 1,000 µm; 50 to 100 µm, 50 to 200 µm and 50 to 1,000 µm; 100 to 200 µm and 100 to 1,000 µm; and 200 to 1,000 µm.

All other multiple numerical ranges relating to a particular feature are intended to be construed accordingly.

When used herein, "perovskite nanocrystal" is intended to refer to a crystalline material having a size (e.g. length) in the nanoscale range. Examples of such materials include those having a length of from 2 to 100 nm, such as from 5 to 50 nm, such as from 10 to 20 nm. When used herein "length" is taken to be the longest dimension of the nanocrystal for measurement. Measurement of nanocrystals as described herein may be accomplished using transmission electron microscopy. For example, TEM images may be recorded using a JEOL JEM-3011 microscope operated at 300 kV. TEM samples can be prepared by diluting the nanocrystal/composite solutions in toluene, followed by drop-casting the solution on a copper grid.

When used herein, the term "aggregate of perovskite nanocrystals" refers to a cluster of perovskite nanocrystals, as defined hereinbefore, held together by intermolecular interactions, such as van der Waals forces, and the like. These aggregates may have any suitable size/diameter. For example, each aggregate of perovskite nanocrystals may have a diameter of from 50 to 5,000 nm, such as from 100 to 1,000 nm.

As discussed hereinbefore, the perovskite material used in embodiments of the invention has the formula I:

$$APbX_3 \qquad\qquad\qquad\qquad\qquad I,$$

where:
X is a halogen anion selected from one or more of Br, Cl, I;
A is a monovalent cation selected from one or more of Cs, an alkylammonium ion, and a formamidinium ion.

It is specifically contemplated herein that the films may contain only perovskite nanocrystals, only aggregates of perovskite nanocrystals or combinations thereof.

For the avoidance of doubt, X can be one of Br, Cl or I or it can be a mixture of two or three of these anions. Similarly, A may be one of Cs, an alkylammonium ion, and a formamidinium ion or it may be a mixture of two or all three of these cations. When two or three of these anions/cations are used for the perovskite, any suitable molar ratio may be used. For example, when Br and I are used, the molar ratio of Br to I may be from 0.01:0.99 to 99:1 and any value in between.

When used herein, the term "alkylammonium ion" is intended to refer to a monoalkyl ammonium species, such as methylammonium ($CH_3NH_3+$). The alkyl group may have from one to 10 carbon atoms and may be branched or linear.

The polymeric matrix used in the film may be formed from any suitable polymeric material. Particular polymeric matrix materials that may be mentioned herein include those that are formed from monomers comprising a vinyl group ($H_2C=CH—$). Examples of such monomers that may be mentioned herein include, but are not limited to styrenes and an acrylate esters. When used herein "acrylate ester" is intended to refer to monomeric compounds where the carboxylic acid group is presented in the form of an ester, such as, but not limited to, methyl methacrylate, lauryl methacrylate and isobornyl acrylate. As will be appreciated, styrene may be used as the monomer, as may any suitable derivative of styrene (e.g. where the phenyl ring is substituted by a $C_{1-6}$ alkyl group or a halo group), or one or more styrenes may be used. For the avoidance of doubt, one or more of the monomers may be used to generate the polymeric matrix material referred to herein. When one or more monomers are used, any suitable combination of styrenes and acrylates is contemplated. For example, when there is more than one monomer, it may be selected from: two or more styrenes; two or more acrylates; or at least one styrene and at least one acrylate. As will be appreciated, this means that any reference to "monomer", "monomers" and "monomeric materials" below (or their derivatives—i.e. oligomers and polymers) in relation to the manufacturing of the desired film above may be made from one or more of monomers covered by the classes described above. In other words, the resultant film may contain homopolymers or copolymers or, in certain cases, may contain two or more polymeric materials (e.g. the film may contain: two or more homopolymers; two or more copolymers; or at least one homopolymer and at least one copolymer).

In particular embodiments of the invention mentioned herein, the polymeric matrix material may be one that has been crosslinked together by way of crosslinking groups. In embodiments of the invention where crosslinking is used, the crosslinking groups may be derived from any suitable crosslinking agent. As will be appreciated, the crosslinking agent should be a material that is compatible with the monomeric materials used and may contain two to five groups capable of forming bonds to the monomer/growing polymer chain. For example, when the monomers comprise a vinyl group, then the crosslinking agent may comprise from two to five, such as from two to three, vinyl groups. Examples of crosslinking agents suitable to form crosslinks with vinyl monomers/polymers of the kind described herein include, but are not limited to, poly(propylene glycol) diacrylate, bisphenol A diacrylate, bisphenol A diethoxylate diacrylate, trimethylolpropane triacrylate, neopentyl glycol propoxylate diacrylate, neopentyl glycol diacrylate, urethane diacrylate and tricycle[5.2.1.0]decanedimethanol diacrylate.

In embodiments where the polymeric matrix material is crosslinked, any suitable ratio of monomeric repeating units to crosslinking units may be used. For example, the crosslinked polymeric matrix material may comprise a wt:wt ratio of monomeric repeating units to crosslinking units of from 0.02:1 to 50:1, such as from 0.1:1 to 10:1, such as from 0.2:1 to 5:1, such as from 0.5:1 to 2:1.

As will be appreciated, any suitable amount of the polymeric matrix material and the perovskite particles and/or perovskite aggregates may be used in the films disclosed herein. For example, the film may comprise from 0.05 to 50 wt % of the plurality of perovskite particles and/or perovskite aggregates and from 50 to 99.95 wt % of the polymeric matrix material. In particular embodiments disclosed herein, the plurality of perovskite particles and/or perovskite aggregates may be present in an amount of:
(a) from 0.05 to 1 wt % of the entire weight of the film; or
(b) from 30 to 50 wt % of the entire weight of the film.
Alternatively or additionally, the perovskite particles (i.e. the plurality of perovskite particles and/or perovskite aggregates) may be provided in a weight to weight ratio of from 0.0002:1 to 1:1, such as from 0.0005:1 to 0.5:1, such as from 0.001:1 to 0.1:1 relative to the polymeric matrix material. For example, the plurality of perovskite particles and/or perovskite aggregates may be present in a weight to weight ratio of from 0.0002:1 to 0.01:1 or from 0.1:1 to 1:1 relative to the weight of the polymeric matrix material.

The films disclosed herein may display one or more of: improved stability; increased luminescence; and increased quantum efficiencies when compared to other films that appear to have a similar composition. Without wishing to be bound by theory, it is believed that these effects may be achieved due to the spacing between the perovskite particles (whether nanocrystals and/or aggregates thereof) and/or due to the method of manufacture of these films. As discussed below in more detail, the films of the current invention may be formed from various compositions where the perovskite particles (nanocrystals and aggregates) can act as a photoinitiator, thereby forming a stronger attachment to the resulting polymeric matrix material, which may in turn provide the advantages discussed above.

Also disclosed herein is a perovskite polymer resin composition comprising:
perovskite nanocrystals and/or aggregates of perovskite nanocrystals, the perovskite material of the nanocrystals and/or aggregates having formula I:

$$APbX_3 \qquad\qquad\qquad\qquad\qquad I,$$

a polymerisation mixture, comprising a monomer and optionally one or more of oligomers and polymers derived from the monomer;
a crosslinking agent; and
optionally, a photoinitiator, wherein:
X is a halogen anion selected from one or more of Br, Cl, I;
A is a monovalent cation selected from one or more of Cs, an alkylammonium ion, and a formamidinium ion. This material is a precursor material that may be used to form the film disclosed hereinbefore. As noted previously, the perovskite material may be used as a photoinitiator, so the inclusion of a separate photoinitiator material is therefore optional. For the avoidance of doubt, where a material listed directly above is also listed in aspects and embodiments of the invention describing the film, then it is the same material and the description and definitions attached to that material also apply to this aspect and its embodiments.

When referred to herein, the polymerisation mixture is generally a liquid material under ambient conditions (e.g. standard temperature and pressure). The polymerisation mixture may comprise a monomer comprising a vinyl group and the optional oligomers and/or polymers are derived from said monomer. In embodiments where the polymerisation mixture comprises oligomers and/or polymers, it will be appreciated that the mixture remains as a generally liquid material and that the mixture still contains the monomeric material in an amount sufficient to generate the desired polymeric film following crosslinking. In embodiments where the polymerisation mixture also includes polymers and/or oligomers, along with monomers, it may be obtained by any suitable means. For example, such polymerisation mixtures may be obtained by the partial polymerisation of a suitable monomer (or monomers) to provide a mixture that comprises polymers, oligomers and monomers. The partial polymerisation may be achieved by any suitable means, such as by the use of a photoinitiator polymerisation as described in the examples. As will be appreciated, the polymerisation mixture has not been subjected to crosslinking, which will occur when the composition is exposed to light to cure the resin composition. For the avoidance of doubt, the polymerisation mixture may use the monomers described hereinbefore and one or more of these monomers may be used in combination to produce the polymeric matrix material of the film. The crosslinking agent used may also be the same as described hereinbefore.

As noted above, the perovskite polymer resin composition disclosed above does not need to contain a separate photoinitiator (as the perovskite may act as a photoinitiator itself), but the composition may also contain an additional photoinitiator in certain embodiments. As will be appreciated, the photoinitiator may be any suitable material that can be used to initiate polymerisation/crosslinking of monomers/polymers, except that the photoinitiator is not itself a perovskite (i.e. the additional photoinitiator added to the compositions is not a perovskite). Suitable materials that may be mentioned include hydroxyalkyl phenyl ketones, benzoins and the like. Further examples of photoinitiators that may be mentioned herein include, but are not limited to 2,2-dimethoxy-2-phenylacetophenone (DMPA), and/or phenylbis(2,4,6-trimethylbenzoyl)-phosphine oxide.

Any suitable combination of ingredients that can form a film described above may be used. For example, the resin may be one selected from:

(a) from 0.05 to 50 wt % of the perovskite nanocrystals and/or aggregates of perovskite nanocrystals;
from 2 to 99.95 wt % of the polymerisation mixture;
from 2 to 99.95 wt % of the crosslinking agent; and
from 0 to 2.5 wt % of the photoinitiator,
(b) from 0.1 to 50 wt % of the perovskite nanocrystals and/or aggregates of perovskite nanocrystals;
from 40 to 70 wt % of the polymerisation mixture;
from 10 to 45 wt % of the crosslinking agent; and
from 0 to 2.5 wt % of the photoinitiator;
(c) from 0.1 to 1 wt % of the perovskite nanocrystals and/or aggregates of perovskite nanocrystals;
from 55 to 70 wt % of the polymerisation mixture;
from 25 to 45 wt % of the crosslinking agent; and
from 0 to 2.5 wt % of the photoinitiator; or
(d) from 30 to 50 wt % of the perovskite nanocrystals and/or aggregates of perovskite nanocrystals;
from 20 to 50 wt % of the polymerisation mixture;
from 20 to 40 wt % of the crosslinking agent; and
from 0 to 2.5 wt % of the photoinitiator.

In additional or alternative embodiments, the resin may be one in which one or more of the following apply:
(a) the weight to weight ratio of the perovskite nanocrystals and/or aggregates of perovskite nanocrystals to the sum of the weights of the polymerisation mixture and crosslinking agent may be from 0.0002:1 to 1:1, such as from 0.0005:1 to 0.5:1, such as from 0.001:1 to 0.1:1, such as from 0.1:1 to 1:1;
(b) the weight to weight ratio of the photoinitiator to the sum of the weights of the polymerisation mixture and crosslinking agent may be from 0.001:1 to 0.03:1;
(c) the weight to weight ratio of the polymerisation mixture to the crosslinking agent may be from 0.02:1 to 50:1, such as from 0.1:1 to 10:1, such as from 0.2:1 to 5:1, such as from 0.5:1 to 2:1.

In further aspects and embodiments of the invention, an alternative perovskite-polymer resin composition may be used as an intermediate. In this case, the perovskite-polymer resin composition comprises:
a perovskite-polymer composite material comprising:
perovskite nanocrystals and/or aggregates of perovskite nanocrystals, the perovskite material of the nanocrystals and/or aggregates having formula I:

$$APbX_3 \qquad \text{I; and}$$

a polymer shell material surrounding each perovskite nanocrystals and/or aggregates of perovskite nanocrystals;
a crosslinking agent;
a photoinitiator; and
optionally, a polymerisation mixture comprising a monomer and optionally one or more of oligomers and polymers derived from the monomer, wherein:
X is a halogen anion selected from one or more of Br, Cl, I;
A is a monovalent cation selected from one or more of Cs, an alkylammonium ion, and a formamidinium ion. For the avoidance of doubt, the perovskite nanocrystals and/or aggregates of perovskite nanocrystals, photoinitiator and crosslinking agent may be defined as described above. In this case, the perovskite nanocrystals and/or aggregates of perovskite nanocrystals are provided in the form of a perovskite-polymer composite material, where the perovskite material has already been reacted with monomeric materials (e.g. of the kinds described above) to form a polymer shell material around the perovskite materials. This material, when combined with a crosslinking agent and a photoinitiator, may be used to form a film as described hereinbefore. It will be appreciated that the pre-polymerisation step may be incomplete, such that the perovskite-polymer composite material may further comprise oligomers and unreacted monomers. In certain embodiments described above, when a perovskite-polymer composite material is used, it may optionally be accompanied by a polymerisation mixture as defined hereinbefore. When a polymerisation mixture is utilised, the monomer (or monomers) of the polymerisation mixture may be different to that used in the polymer shell material.

Any suitable combination of ingredients that can form a film described above may be used. For example, the resin may be one selected from:
(a) from 0.05 to 50 wt % of the perovskite nanocrystals and/or aggregates of perovskite nanocrystals;
  from 2 to 99.95 wt % of the polymer shell material;
  from 2 to 99.95 wt % of the crosslinking agent;
  from 0 to 2.5 wt % of the photoinitiator,
(b) from 0.1 to 50 wt % of the perovskite nanocrystals and/or aggregates of perovskite nanocrystals;
  from 40 to 70 wt % of the polymer shell material;
  from 10 to 45 wt % of the crosslinking agent; and
  from 0 to 2.5 wt % of the photoinitiator
(c) from 0.1 to 1 wt % of the perovskite nanocrystals and/or aggregates of perovskite nanocrystals;
  from 55 to 70 wt % of the polymer shell material;
  from 25 to 45 wt % of the crosslinking agent; and
  from 0 to 2.5 wt % of the photoinitiator; or
(d) from 30 to 50 wt % of the perovskite nanocrystals and/or aggregates of perovskite nanocrystals;
  from 20 to 50 wt % of the polymer shell material;
  from 20 to 40 wt % of the crosslinking agent; and
  from 0 to 2.5 wt % of the photoinitiator.

In the embodiments of (a) to (d) above, when a polymerisation mixture is included, then the wt % presented above for the polymer shell material represents the sum of the weight percentages of the polymer shell material and the polymerisation mixture.

In additional or alternative embodiments, the resin may be one in which one or more of the following apply:
(a) the weight to weight ratio of the perovskite nanocrystals and/or aggregates of perovskite nanocrystals to the sum of the weights of the polymeric shell material and crosslinking agent may be from 0.0002:1 to 1:1, such as from 0.0005:1 to 0.5:1, such as from 0.001:1 to 0.1:1, such as from 0.1:1 to 1:1; and/or
(b) the weight to weight ratio of the photoinitiator to the sum of the weights of the polymeric shell material and crosslinking agent may be from 0.001:1 to 0.03:1.

As will be appreciated, a suitable ratio of polymeric material (in the polymer shell) to crosslinking agent may be used. For example, a wt:wt ratio of the polymer shell material to the crosslinking agent may be from 0.02:1 to 50:1, such as from 0.1:1 to 10:1, such as from 0.2:1 to 5:1, such as from 0.5:1 to 2:1.

In yet further aspects and embodiments of the invention, a perovskite ink may be used as a precursor to the film disclosed herein. That is, there is also disclosed a perovskite ink, comprising:
  perovskite nanocrystals and/or aggregates of perovskite nanocrystals dispersed throughout the polymeric matrix material, the perovskite material of the nanocrystals and/or aggregates having formula I:

$$APbX_3 \qquad \text{I; and}$$

a vinyl monomer, wherein:
X is a halogen anion selected from one or more of Br, Cl, I;
A is a monovalent cation selected from one or more of Cs, an alkylammonium ion, and a formamidinium ion. For the avoidance of doubt, components described above found in other aspects and embodiments may be considered to have the same definitions. As noted above, the inks described immediately above do not need to contain a crosslinking agent. However, in particular embodiments of the invention, the inks may further comprise a crosslinking agent. For the avoidance of doubt, the crosslinking agents used in the ink may be the same as those described hereinbefore.

As will be appreciated, as the perovskites disclosed herein may act as a photoinitiator, there is no need for a separate photoinitiator to be included in the inks. However, if desired, a separate photoinitiator as described hereinbefore may be used.

Any suitable combination of ingredients that can form a film described above may be used. For example, the ink may be selected from one of:
(a) from 0.05 to 50 wt % of the perovskite nanocrystals and/or aggregates of perovskite nanocrystals;
  from 2 to 99.95 wt % of the vinyl monomer;
  from 2 to 99.95 wt % of the crosslinking agent; and
  from 0 to 2.5 wt % of the photoinitiator,
(b) from 0.1 to 50 wt % of the perovskite nanocrystals and/or aggregates of perovskite nanocrystals;
  from 40 to 70 wt % of the vinyl monomer;
  from 10 to 45 wt % of the crosslinking agent; and
  from 0 to 2.5 wt % of the photoinitiator;
(c) from 0.1 to 1 wt % of the perovskite nanocrystals and/or aggregates of perovskite nanocrystals;
  from 55 to 70 wt % of the vinyl monomer;
  from 25 to 45 wt % of the crosslinking agent; and
  from 0 to 2.5 wt % of the photoinitiator; or
(d) from 30 to 50 wt % of the perovskite nanocrystals and/or aggregates of perovskite nanocrystals;
  from 20 to 50 wt % of the vinyl monomer;
  from 20 to 40 wt % of the crosslinking agent; and
  from 0 to 2.5 wt % of the photoinitiator.

As will be appreciated, a suitable ratio of vinyl monomer to crosslinking agent (when present) may be used. For example, a wt:wt ratio of the vinyl monomer to the crosslinking agent may be from 0.02:1 to 50:1, such as from 0.1:1 to 10:1, such as from 0.2:1 to 5:1, such as from 0.5:1 to 2:1.

In additional or alternative embodiments, the ink may be one in which:
(a) the weight to weight ratio of the perovskite nanocrystals and/or aggregates of perovskite nanocrystals to the sum of the weights of the vinyl monomer and, where present, crosslinking agent may be from 0.0002:1 to 1:1, such as from 0.0005:1 to 0.5:1, such as from 0.001:1 to 0.1:1, such as from 0.1:1 to 1:1; and/or
(b) the weight to weight ratio of the photoinitiator to the sum of the weights of the vinyl monomer and, where present, crosslinking agent may be from 0.001:1 to 0.03:1.

As noted above, the intermediate compositions and inks described above can all be used to manufacture a film as described above. This may be accomplished in a method of fabricating a luminescent film, comprising the steps of:

(a) coating a perovskite polymer resin, a perovskite polymer composition, or a perovskite ink as described above onto a transparent substrate material (e.g. a transparent polymer or glass substrate) to form a coated substrate; and
(b) exposing the coated substrate to light to promote polymerization and/or curing.

In embodiments of the invention described above, the resins/compositions/inks described above may have a viscosity of from 50 to 2,000 cP. Without wishing to be bound by theory, it is believed that the use of materials having this viscosity range may provide particularly stable films (e.g. with regard to heat, light and humidity), as shown in Example 10. Resins/compositions/inks having this viscosity range may be formed by careful selection of the base ingredients (e.g. monomers, crosslinkers etc.). However, in the situation where the use of a particular monomer would provide a material having a viscosity outside this desired range, then it is possible to remedy this by pre-polymerisation. When used in this context, pre-polymerisation may apply to: (a) conducting a pre-polymerisation step with the monomer(s) and the perovskite material to form a perovskite-polymer nanocomposite material (which may still contain monomeric materials in certain embodiments); or (b) subjecting the monomer(s) to a partial pre-polymerisation step using a suitable photoinitiator (that is not a perovskite material). Further details of such methods are described hereinbefore. In any event, it is believed that the use of such pre-polymerisation steps generally help to increase the stability of the final films to heat, light and humidity.

Any suitable transparent polymer may be used as the substrate, provided that the polymer does not react with any of the components contained within the formulations disclosed above.

As disclosed herein, perovskite semiconductor nanocrystals have been applied to the photo-activated synthesis of high molecular weight polymers, and additionally resulted in functional nanocomposite films that possess enhanced luminescence and stability. This approach enables the simple and general synthesis of polymer films comprising, for example vinyl polymers, and may be applied to a wide array of commercially useful polymers and related optoelectronic products.

Further aspects and embodiments of the invention are provided in the following non-limiting examples.

EXAMPLES

The current invention relates to a new method towards achieving a spatially-dispersed perovskite-polymer nanocomposite or resin, using an in-situ photo-activated polymerisation approach. Remarkably, perovskite was capable of acting as a photo-initiator for the polymerisation or pre-polymerisation of vinyl polymers, and a simple white-light illumination of perovskite nanocrystals dispersed within a monomer liquid was sufficient for the preparation of the perovskite-polymer nanocomposites. The nanocomposites possess enhanced luminescence and stability.

Materials and Methods

Chemicals, such as cesium carbonate ($Cs_2CO_3$, 99.9%), lead(II) iodide ($PbI_2$, 99.999%), lead(II) bromide ($PbBr_2$, 99.999%), 1-octadecene (ODE, 90%), oleic acid (technical grade, 90%), oleylamine (80-90%), styrene (99%), methyl methacrylate (MMA, 99%), poly(propylene glycol) diacrylate (PPG, average $M_n$~800), 2,2-Dimethoxy-2-phenylacetophenone (DMPA, 99%), polystyrene (average $M_w$ 35,000), isobornyl acrylate (IBOA, technical grade), tricyclo[5.2.1.0$^{2,6}$]decanedimethanol diacrylate (DCPDA), bisphenol A ethoxylate diacrylate ($M_n$~468), trimethylolpropane triacrylate (TMPTA, technical grade), lauryl methacrylate (LMA, 96%) were purchased from Sigma-Aldrich and used as received. Solvents, such as cyclohexane (anhydrous grade, 95%), toluene (AR grade) and 1,2,4-trichlorobenzene (HPLC grade, >99%) were purchased from Sigma-Aldrich and used without further purification.

Photoluminescence quantum yield (PLQY): The photoluminescence spectra and photoluminescence quantum yield were obtained by photo-exciting the thin-film samples in an integrating sphere, using a Spectra-Physics 405 nm (100 mW, CW) diode laser, and measuring the absorption and photoluminescence using a calibrated Ocean Optics Flame-T spectrometer.

Nuclear magnetic resonance (NMR): $^1$H NMR spectra were recorded on a Bruker AV500 (500 MHz). Chemical shifts were calibrated using residual undeuterated solvent as an internal reference ($CDCl_3$, δ 7.26 ppm) for $^1$H NMR.

Gel permeation chromatography (GPC): GPC measurements were performed using Agilent Technologies 1260 Infinity II High Temperature GPC System, equipped with a refractive index analyzer. The guard column is a 50 mm×7.5 mm, 10 μm PL gel column, whereas the analytical column comprises two 300 mm×7.5 mm, 10 μm mixed-bed PL gel columns. The mobile phase was 1,2,4-trichlorobenzene at a temperature of 160° C. and a flow rate of 1 mL min$^{-1}$. The system was calibrated with polystyrene standards with molecular weights ranging from 0.58 to 6035 kDa.

General Procedure 1—Synthesis of $CsPbX_3$ (X=I, Br) Perovskite Nanocrystals (100)

Cesium lead halide perovskite nanocrystals (or $CsPbX_3$, where X=I, Br) (100) were synthesised in accordance with a previously reported method, via reaction of Cs-oleate with lead halide. (M. V. Kovalenko, et al., *Nano Letters* 2015, 15, 3692).

In a typical procedure, $Cs_2CO_3$ (0.163 g, 0.5 mmol) was loaded into a 50 mL three-neck flask along with 1-octadecene (ODE) (8 mL) and oleic acid (OA) (0.5 mL), and the mixture was dried under vacuum at 120° C. for 30 minutes. The solution was heated to 150° C. under Ar for 10 minutes to give a Cs-oleate solution, which was then kept at 100° C. before injection. Separately, $PbX_2$ (0.188 mmol), such as $PbI_2$ (0.087 g) or $PbBr_2$ (0.069 g), and ODE (5 mL) were loaded into a 25 mL three-neck flask and dried under vacuum at 120° C. for 1 h. Dried oleylamine (OLA) (0.5 mL) and OA (0.5 mL) were added into the mixture at 120° C. under Ar. After complete solubilization of the $PbX_2$, the temperature was raised to 180° C. and the Cs-oleate solution (0.4 mL, 0.125 M in ODE, prepared as described above) was quickly injected. After 10 s, the reaction mixture was cooled in an ice-water bath. After centrifugation (10,000 rpm for 5 minutes), the nanocrystals were collected, and the supernatant was discarded. The nanocrystals were washed once by re-dispersion in ODE, followed by centrifugation (10,000 rpm for 5 minutes). Finally, the purified $CsPbX_3$ perovskite nanocrystals (100) were re-dispersed in anhydrous cyclohexane (5 mL).

General Procedure 2—Scaled-Up Synthesis of $CsPbX_3$ (X=I, Br) Perovskite Nanocrystals $Cs_2CO_3$ (1.63 g) was loaded into a 250 mL three-neck flask along with 1-octadecene (ODE) (80 mL) and oleic acid (OA) (5 mL), and the mixture was dried under vacuum at 120° C. for 30 minutes. The solution was heated to 150° C. under Ar for 10 minutes to give a Cs-oleate solution, which was then kept at 100° C. before injection. Separately, $PbX_2$ (18.8 mmol), such as $PbI_2$ (8.7 g) or $PbBr_2$ (6.9 g), and ODE (500 mL) were loaded into a 1 L three-neck flask and dried under vacuum at 120° C. for 1 h. Dried oleylamine (OLA) (50 mL) and OA (50 mL) were added into the mixture at 120° C. under Ar. After complete solubilization of the $PbX_2$, the temperature was raised to 180° C. and the Cs-oleate solution (40 mL, 0.125 M in ODE) was quickly injected. After 10 seconds, the reaction mixture was cooled in an ice-water bath. After centrifugation, the nanocrystals were collected, and the supernatant was discarded. The nanocrystals were washed once by re-dispersion in ODE, followed by centrifugation. Finally, the purified $CsPbX_3$ perovskite nanocrystals were re-dispersed in anhydrous cyclohexane (500 mL).

General Procedure 3—Synthesis of $FA_xCs_{1-x}PbX_3$ (X=I, Br) Perovskite $Cs_2CO_3$ (1.63 g) was loaded into a 250 mL three-neck flask along with 1-octadecene (ODE) (80 mL) and oleic acid (OA) (5 mL), and the mixture was dried under vacuum at 120° C. for 30 minutes. The solution was heated to 150° C. under Ar for 10 minutes to give a Cs-oleate solution, which was then kept at 100° C. before injection.

Separately, formamidinium acetate (125 mmol, 13 g, Aldrich, 99%) was loaded into a 500 mL 3-neck flask along with dried oleic acid (200 mL, vacuum-dried at 120° C.), and dried at 50° C. under vacuum until the reaction is completed to give a FA-oleate solution.

Still separately, $PbX_2$ (37.6 mmol), such as $PbBr_2$ (13.8 g) or $PbI_2$ (17.3 g) and ODE (1000 mL) were loaded into a 2 L three-neck flask and dried under vacuum at 120° C. for 1 h. Dried oleylamine (OLA) (100 mL) and OA (100 mL) were added into the mixture at 120° C. under Ar. After complete solubilization of the $PbBr_2$, the temperature was raised to 180° C. and the Cs-oleate solution (80 mL, prepared as described above) and FA-oleate solution (200 mL, prepared as described above) was quickly injected. After 10 seconds, the reaction mixture was cooled in an ice-water bath. After centrifugation, the nanocrystals were collected, and the supernatant was discarded. The nanocrystals were washed once by re-dispersion in ODE, followed by centrifugation. Finally, the purified $FA_xCs_{1-x}PbX_3$ perovskite nanocrystals were re-dispersed in anhydrous cyclohexane (1000 mL).

General Procedure 4—Pre-Polymerisation of Methyl Methacrylate (MMA) or Isobornyl Acrylate IBOA Using 2,2-Dimethoxy-2-Phenylacetophenone (DPMA)

1 wt % of 2,2-Dimethoxy-2-phenylacetophenone (DMPA) was added to a 2 L one-neck flask filled with 1 L of MMA (or IBOA) solution. The mixture was bubbled with Ar for 10 minutes using a Schlenk line. The mixture was then exposed to UV light (365 nm, 46 W) for 30 minutes to give a pre-polymerised MMA or IBOA.

Example 1. Preparation of $CsPbBr_3$ Perovskite-Polystyrene Nanocomposite Via $CsPbBr_3$ Perovskite-Initiated Photo-Polymerisation of Styrene The $CsPbBr_3$ perovskite nanocrystals (100, prepared via General procedure 1) was dispersed in a styrene monomer under white-LED illumination in an argon atmosphere to give a $CsPbBr_3$ perovskite-polystyrene nanocomposite solution. The procedure was repeated with different durations of white-LED illumination time (2-14 h). The nanocomposite solutions obtained were then casted onto glass substrates to give thin-film samples, which were subsequently characterised.

Preparation of $CsPbBr_3$ Perovskite-Styrene Nanocomposite Solution

In a typical procedure, the $CsPbBr_3$ nanocrystal solution in cyclohexane (400 µL, 5 mg/mL) was added into an 8 mL glass vial with a magnetic stirring bar. The cyclohexane was completely removed by vacuum, leaving $CsPbBr_3$ perovskite nanocrystal solid (100). 1 mL of styrene was added into the glass vial at room temperature to give a homogenous dispersion, where the $CsPbBr_3$ perovskite is present at 0.2 w % concentration. The mixture was bubbled with Ar for 3 minutes using a Schlenk line. The mixture was then transferred into an Ar-filled glovebox and irradiated by a white LED strip (4.6 W, 1.1 m) for a predetermined amount of time (2-14 hours) to give a $CsPbBr_3$ perovskite-styrene nanocomposite solution.

Preparation of Thin-Film Sample

The $CsPbBr_3$ perovskite-styrene nanocomposite solution (80 µL) was directly drop-casted onto a 1.5 cm by 1.5 cm glass substrate and left to dry for 30 minutes under ambient conditions (25° C., air) in a fume hood to dry off unreacted styrene monomers, thereby forming a $CsPbBr_3$ perovskite-polystyrene nanocomposite thin film.

Photoluminescence

The photoluminescence quantum yield (PLQY) of all thin-film samples in an integrating sphere is tabulated in Table 1 as a function of reaction time. FIG. 1 shows the PL spectrum and UV fluorescence image of a $CsPbBr_3$ perovskite-polystyrene thin film, prepared after a 14-hour photopolymerisation reaction (14-hour sample).

Remarkably, the films prepared from the photo-polymerised samples exhibited higher PLQYs than the control sample, with the 14-hour sample giving a PLQY of 44%, compared to just 13% in the unreacted control sample, which is a thin film sample prepared from an unreacted (not irradiated) nanocrystal solution containing 0.2 w % $CsPbBr_3$ perovskite in styrene.

TABLE 1

PL quantum yields of all thin-film samples as a function of reaction time.

| Reaction time (h) | PLQY (%) |
|---|---|
| control | 13 |
| 2 | 16 |
| 4 | 16 |
| 6 | 23 |
| 8 | 42 |
| 10 | 35 |
| 12 | 35 |
| 14 | 44 |

The PLQY of the 14-hour samples as dispersed in styrene containing different loading amounts of $CsPbBr_3$ perovskite is tabulated in Table 2.

Figure 9:
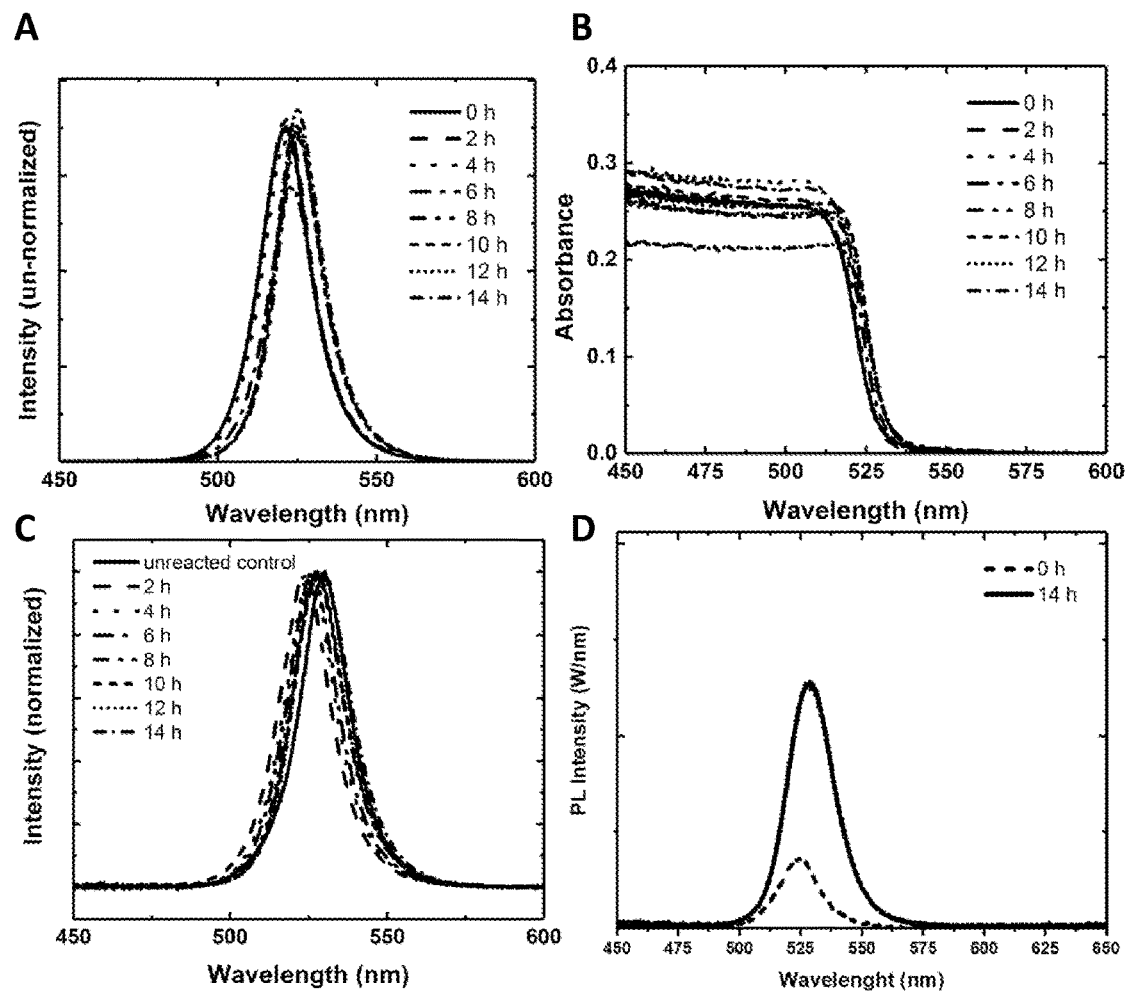
FIG. 9 depicts (A) un-normalised PL spectra; (B) absorbance spectra of CsPbBr$_3$ nanocrystals in styrene after different reaction time. 200 µL of each sample was diluted in 2 mL of toluene for PL and absorbance measurements to prevent spectral saturation; (C) normalised PL spectra of drop-cast CsPbBr$_3$ perovskite-polystyrene nanocomposite films, prepared after different reaction time; and (D) PL spectrum of unreacted sample (before polymerization) and 14-hour sample.

It is worth noting that the PLQY of the 14-hour sample (on film) is similar to that of the nanocomposite as dispersed in styrene. (Table 2) Additional spectral data of the solutions and thin films can are shown in FIG. 9.

TABLE 2

PL quantum yields of 14-hour samples as dispersed in styrene containing different loading concentrations.

| Perovskite Loading (w %) | PLQY (%) |
|---|---|
| 0.1 | 44 |
| 0.2 | 42 |
| 0.4 | 38 |

Transmission Electron Microscopy

Figure 4:
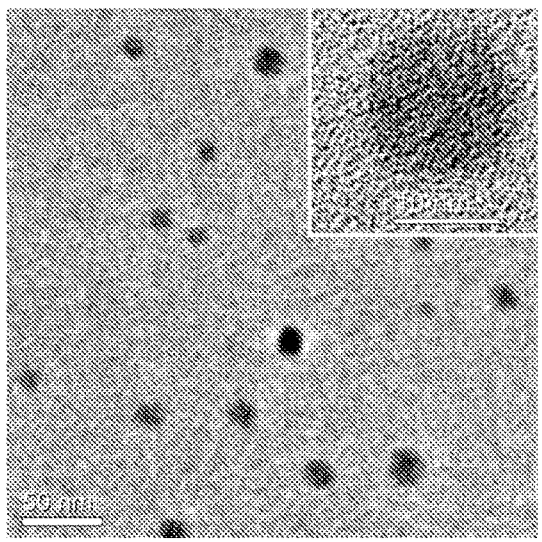
FIG. 4 depicts TEM and HRTEM (inset) images of (A) the CsPbBr$_3$ perovskite-polystyrene nanocomposite film prepared after a 14-hour photo-polymerisation reaction and (B) unreacted close-packed CsPbBr$_3$ perovskite nanocrystals. White bar denotes 50 nm in TEM image; and 10 nm in HRTEM image.
Figure 4:
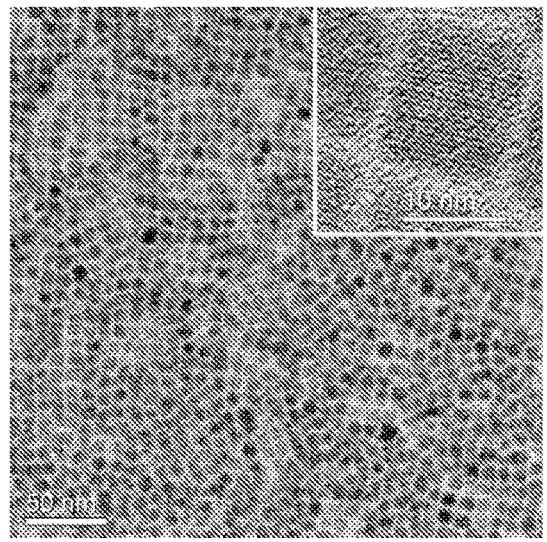

The $CsPbBr_3$ perovskite-polystyrene nanocomposite thin films were imaged using transmission electron microscopy (TEM). The image obtained was compared against the image of the unreacted control sample (FIG. 4).

TEM images were recorded using JEOL JEM-3011 microscope operated at 300 kV. TEM samples were prepared by diluting the nanocrystal/composite solutions in toluene, followed by drop-casting the solution on a copper grid.

Figure 6:
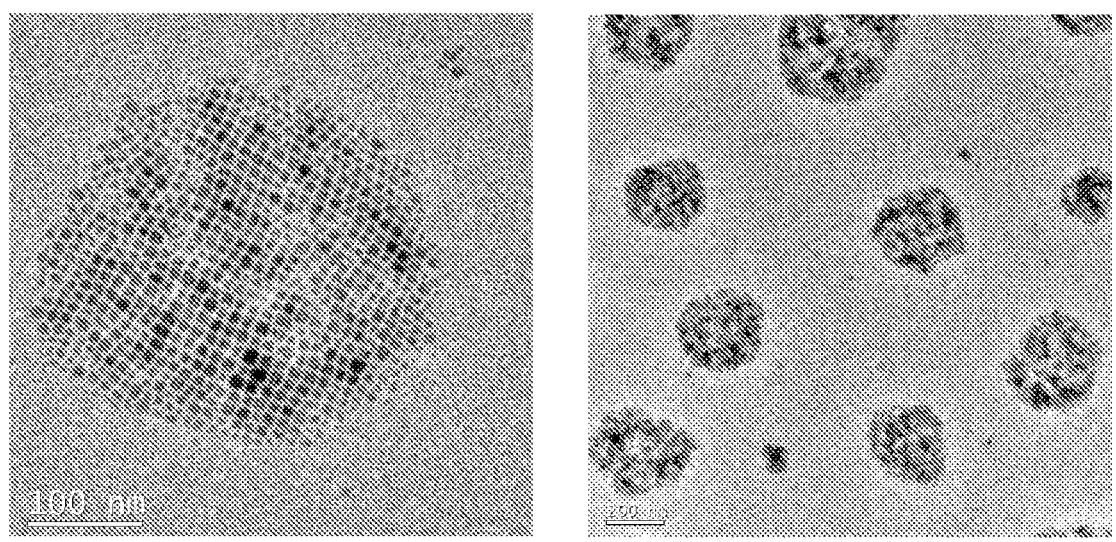
FIG. 6 depicts TEM images of CsPbBr$_3$ nanocrystals blended with pre-synthesised polystyrene.

The 14-hour sample (FIG. 4a) shows individually-dispersed perovskite nanocrystals in a polymer matrix. Such dispersed structures are difficult to achieve by simple perovskite and pre-synthesised polymer blends due to aggregation and phase separation (FIG. 6). In contrast, the unreacted control sample (FIG. 4b) shows a close-packed nanocrystal structure.

Figure 7:
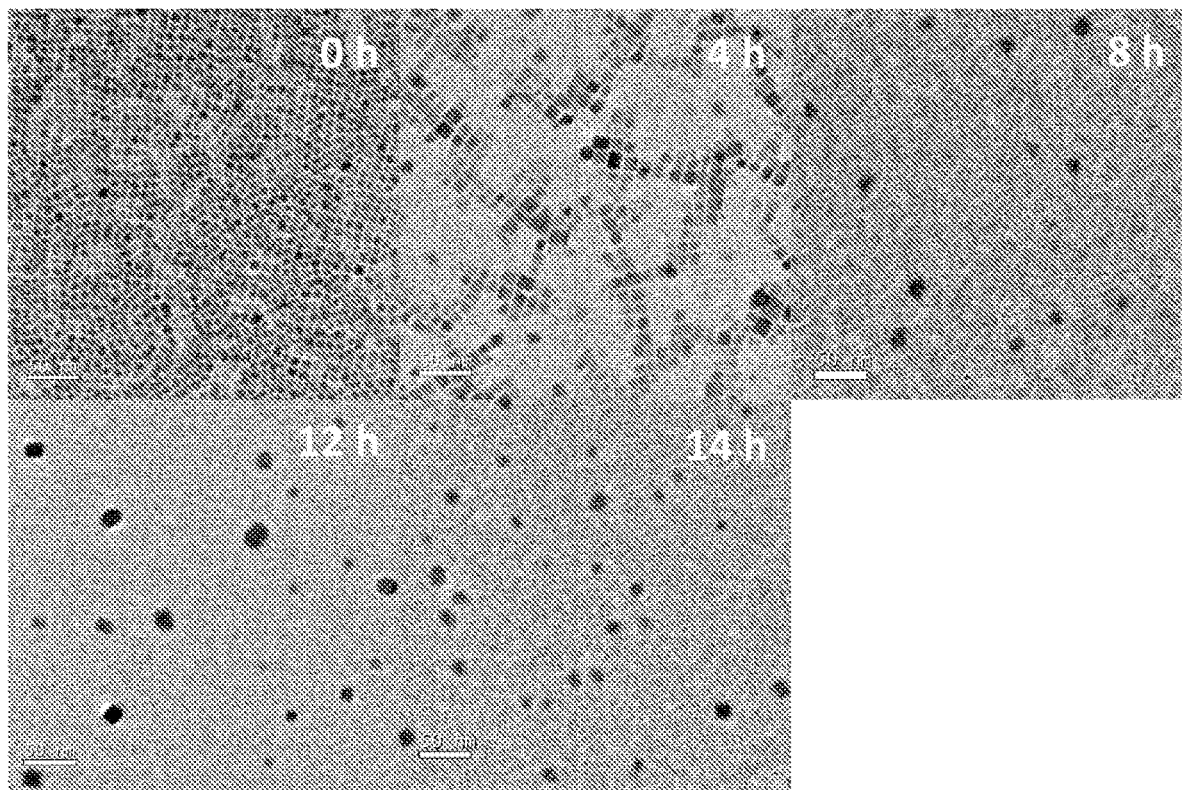
FIG. 7 depicts TEM images showing perovskite nanocrystal distribution in polymer matrix with increasing reaction time (from left to right of upper row, then left to right of lower row: 0, 4, 8, 12, and 14 h).

A time-series evolution of perovskite nanocrystal distribution in polymer matrix is presented in FIG. 7, showing an increasing spatial separation of nanocrystals with reaction time and a complete individualization of nanocrystals by 8 hours. Both the high-resolution TEM images in the insets of FIGS. 4a and 4b show clear lattice fringes, indicating a well-preserved crystalline structure both before and after the reaction.

Without wishing to be bound by theory, it is believed that the improved PLQY in the 14-hour sample is attributed to the spatial dispersion of nanocrystals within the polymer matrix. The separation of emissive crystals shuts off resonant energy transfer to defective and non-emissive crystals, which is a process responsible for luminescence quenching in close-packed structures (C. R. Kagan, et al., Physical Review Letters 1996, 76, 1517). This mechanism of PL enhancement is further corroborated by the fact that all solutions, which comprises spatially-separated crystals in solution, have similar PL intensity (FIG. 9), but the thin-film samples of the $CsPbBr_3$ perovskite-polymer nanocomposites show significantly higher PL than the close-packed film (FIG. 9d).

X-Ray Diffraction

Figure 5:
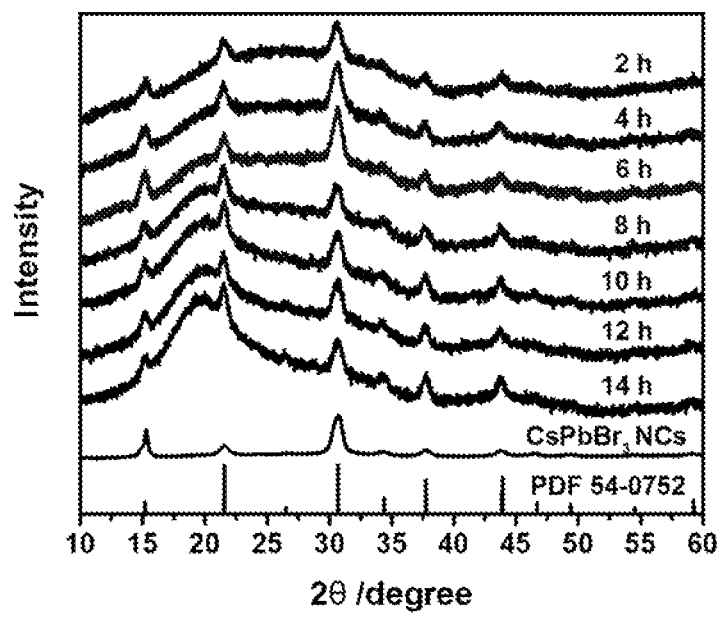
FIG. 5 depicts XRD spectra of the CsPbBr$_3$ perovskite-polystyrene nanocomposite films prepared with different reaction times (2-14 h).

X-ray diffraction (XRD) measurements were performed on the composite thin films samples (FIG. 5). XRD spectra were obtained using a Bruker D8 Advance diffractometer with Cu Kα radiation (0.15418 nm).

All samples show a cubic $CsPbBr_3$ crystal structure with a lattice spacing of 0.583 nm regardless of reaction time, suggesting that there were no structural changes to the perovskites nanocrystals during the photo-polymerisation reaction. A broad amorphous background could be seen appearing as the reaction time increased, and this is due to the scattering of polystyrene in the nanocomposites as the conversion yield increased.

Stability in Water

The stability of the $CsPbBr_3$ perovskite-polystyrene composite film was tested by fully immersing the film in a 30 mL beaker filled with water. The composite film demonstrated remarkable tolerance to water, and shows intense fluorescence even after being fully submerged for 24 hours, showing only a slight drop in PLQY from 44% (0 h immersion) to 36% (24 h immersion). The slight decrease in PLQY may be due to the inherent penetration of moisture through polymer, and may be further circumvented through inorganic barrier layers.

Example 2. Characterisation of Polymerisation Products from Example 1

Figure 2:
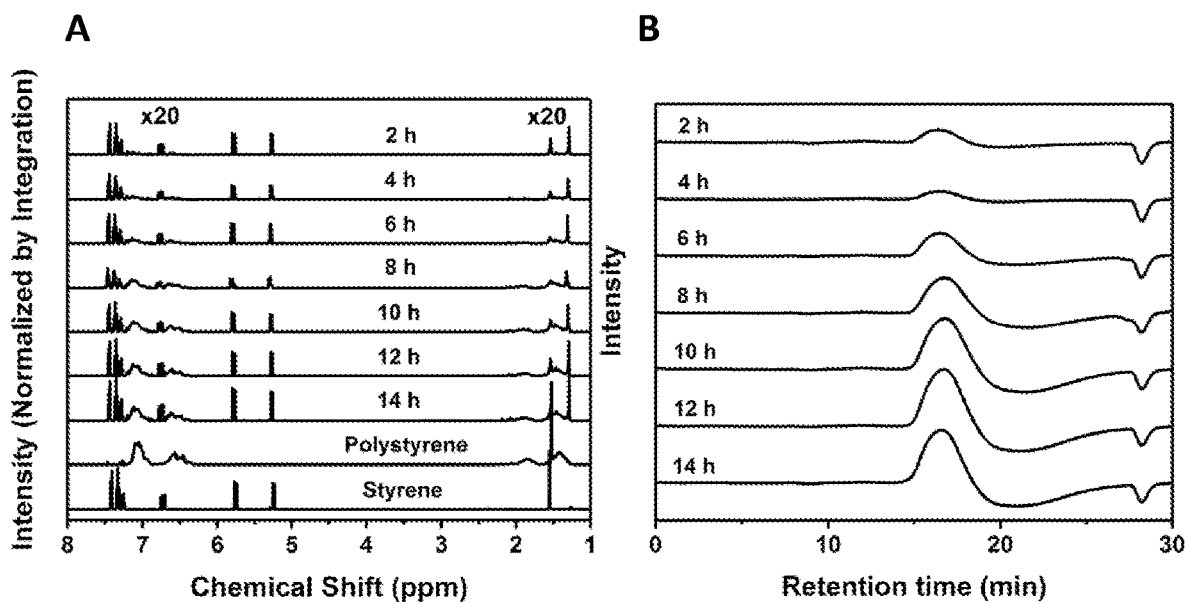
FIG. 2 depicts (A) NMR spectra of photo-polymerised styrene samples, normalised by the integration of styrene protons. Portions representing polystyrene protons are multiplied by 20× for clarity; and (B) GPC spectra of photo-polymerised styrene samples.

The $CsPbBr_3$ perovskite-styrene nanocomposite solutions as prepared from Example 1 were analysed to determine how the reaction time (2-14 hours) affects the extent of styrene polymerisation and its possible effect on PL characteristics. Proton nuclear magnetic resonance ($^1$H-NMR) spectroscopy was used to track the percentage conversion of styrene to polystyrene (FIG. 2a). Gel permeation chromatography (GPC) was used to determine the number and weight average molecular weight (Mn and Mw) as well as the polydispersity index (PDI) of the polystyrene (FIG. 2b). Prior to GPC characterisation, the nanocomposite solutions were purified to remove perovskites.

Procedure for Purification of Polystyrene

In a typical procedure, the $CsPbBr_3$ perovskite-styrene nanocomposite solution (200 μL) was added into 2 mL of deionised water and 2 mL of AR grade toluene. The mixture was sonicated until the perovskite color disappeared, and polystyrene was extracted with excess toluene. The organic layer was collected and dried with calcium chloride. Calcium chloride was removed by filtration to obtain a purified polystyrene solution. The solvent was removed using a rotary evaporator and 1.5 mL of HPLC grade 1,2,4-trichlorobenzene was used to dissolve the polystyrene solids. Solutions were left to stand for at least 2 hours for complete dissolution before GPC measurement.

Characterisation Results

As shown in FIG. 2a, the $^1$H-NMR spectrum of a styrene monomer solution shows characteristic signals at δ 7.23-7.48 ppm, corresponding to the 5 phenyl protons, and at δ 6.73, 5.75, 5.25 ppm corresponding to the 3 vinyl protons. In contrast, the phenyl protons on polystyrene give broad upfield signals at δ 6.85-7.23 and 6.28-6.70 ppm, while the 3 protons on the spa carbon backbone show two broad peaks at δ 1.20-2.14 ppm. The sharp peak at δ 1.29 ppm belongs to the alkyl ligands on the perovskite nanocrystals. Since the signals from styrene and polystyrene do not overlap, their respective integrations were used to determine the percentage conversion of styrene to polystyrene, and their values are tabulated in Table 3.

The NMR spectra of the nanocomposite solutions show that increasing photo-illumination time led to a monotonic increase in percentage conversion of styrene to polystyrene, from 1.4% at 2 hours to 12.0% at 14 hours (Table 3). There was negligible conversion of styrene if no light or no perovskites was used. A stronger 9 W white LED light source (vs. 4.6 W) led to a slight increase in conversion to 14.1% at 14 hours.

Despite the increased conversion at longer reaction times, the GPC data in FIG. 2b shows that the molecular weights and distribution were similar across all samples. Their GPC retention time of 13 minutes corresponds to a high molecular weight of approximately 200 kDa, based on calibration with known polystyrene standards. The PDIs for all samples were generally broad at around 2.0. The Mn, Mw and PDI of all polymer samples, reacted for different durations, are summarised in Table 3.

TABLE 3

Properties of reaction products in terms of percentage conversion, Mn, Mw and PDI.

| Reaction time (h) | Conversion (%) | Mn (kDa) | Mw (kDa) | PDI |
|---|---|---|---|---|
| 2 | 1.4 | 124 | 279 | 2.24 |
| 4 | 2.8 | 123 | 214 | 1.75 |
| 6 | 4.1 | 132 | 251 | 1.90 |
| 8 | 8.3 | 111 | 226 | 2.04 |
| 10 | 10.1 | 116 | 238 | 2.05 |
| 12 | 10.8 | 120 | 246 | 2.05 |
| 14 | 12.0 | 120 | 280 | 2.33 |
| No perovskite (14 h) | 3.2 | — | — | — |
| No light (14 h) | <1 | — | — | — |

Example 3. Reaction Mechanism

The time-increasing conversion yields, time-independent molecular weights, and broad polydispersity as shown in Example 2 are characteristic of a classical free-radical chain-growth polymerisation mechanism (P. C. Hiemenz, T. P. Lodge, Polymer Chemistry, CRC Press, 2007). To support this mechanism, further photo-polymerisation reactions were performed using the procedure of Example 1 and the reaction products were characterised with the "Procedure for purification of polystyrene" of Example 2.

Effect of Perovskite Loading Concentrations

The photo-polymerisation reaction of Example 1 was repeated for 14 hours at different perovskite loading concentrations (Table 4). It was found that the molecular weights and percentage conversion of the polymers increase at lower perovskite loadings. This observation is expected for a free-radical mechanism and is attributed to a reduction in radical concentration and termination events in the reaction mixture. This result also confirms the role of perovskite nanocrystals as the radical-producing photo-initiator.

TABLE 4

Figure 10:
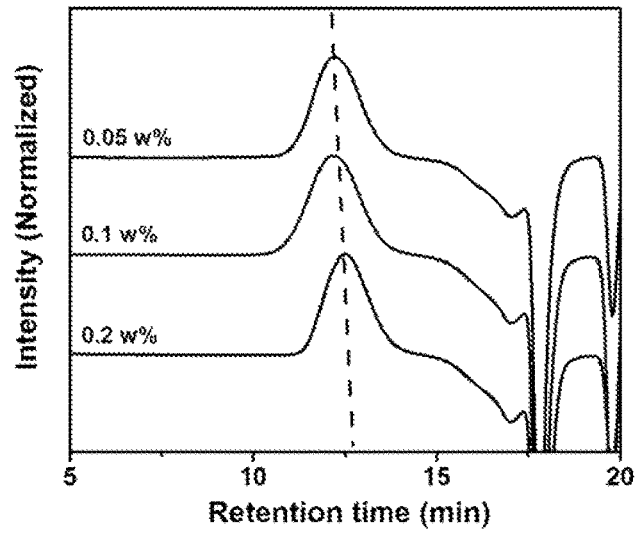
FIG. 10 depicts GPC spectra of photo-polymerised polystyrene at different CsPbBr$_3$ perovskite loading concentrations. All samples were polymerised for 14 hours in the same batch.

Photo-polymerised polystyrene properties as a function of perovskite loading concentration, based on GPC spectra (FIG. 10).

| Perovskite loading (w %) | Conversion (%) | Mn (kDa) | Mw (kDa) | PDI |
|---|---|---|---|---|
| 0.2 | 7.7 | 230 | 428 | 1.86 |
| 0.1 | 12.3 | 344 | 825 | 2.40 |
| 0.05 | 13.3 | 347 | 758 | 2.19 |

Effect of Radical Inhibitors

To check if the polymerisation would be impeded by a radical inhibitor, the photo-polymerisation reaction of Example 1 was repeated for 14 hours but with or without addition of a radical inhibitor (0.1 mmol of 2,2,6,6-tetramethylpiperidin-1-yl)oxyl (TEMPO) or butylated hydroxytoluene (BHT)) (Table 5).

The results show that no reaction was observed in the TEMPO reaction setup, and the conversion yield was significantly lowered in the BHT setup, providing clear support towards a radical mechanism.

TABLE 5

Percentage conversion of polystyrene with and without a polymerisation inhibitor.

| Radical inhibitor | Conversion (%) |
|---|---|
| TEMPO | no reaction |
| BHT | 7.5 |
| — | 14.5 |

Proposed Mechanism

Figure 3:
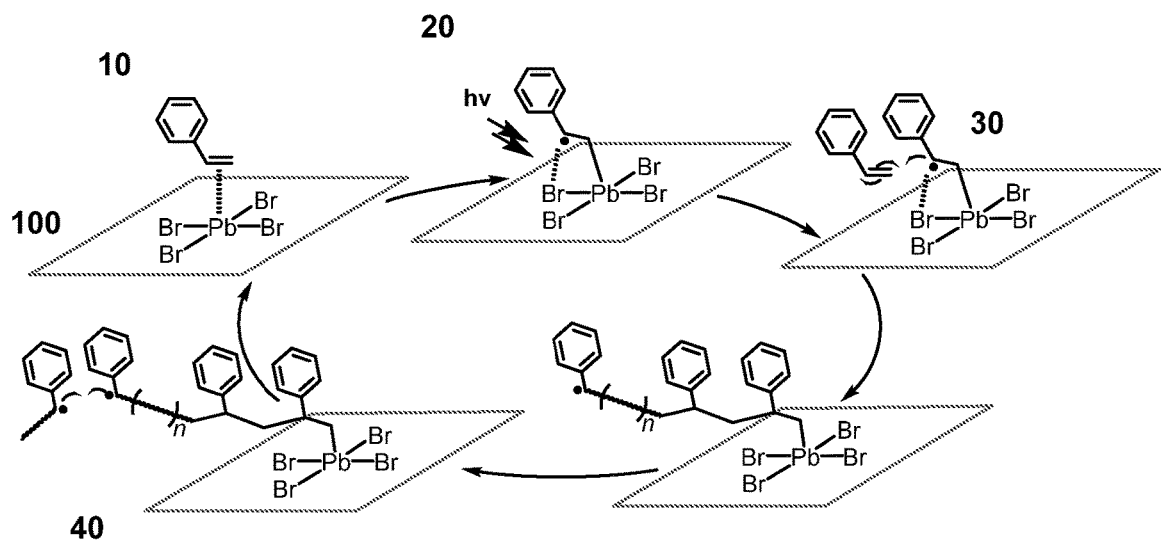
FIG. 3 schematically depicts a proposed reaction mechanism for the CsPbBr$_3$ perovskite (100)-initiated photo-polymerisation of styrene.

With the above-accumulated evidence, we propose a surface-initiated radical chain-growth polymerisation mechanism for our reaction (FIG. 3). We postulate that the adsorption and coordination of the olefin (10) to the $CsPbBr_3$ perovskite (100) could occur through the interaction of the olefin's filled $\pi$ orbitals to an electron-deficient Pb. Photoexcitation (20) of the perovskite triggers the formation of an active radical at the coordinated olefin and leads to the initiation of the polymerisation reaction. Chain propagation (30) proceeds rapidly, and cascades across all styrene molecules in the vicinity. Finally, the reaction terminates via combination with another propagating radical or through chain transfer processes (40). This cycle could occur repeatedly, as long as there are available surface sites for the coordination of monomer and photo-initiation. We speculate that the polymer chains remain attached to the nanocrystal after the reaction, since the conversion rate as shown by Table 2 was observed to slow down with time, suggesting that fewer surface sites became available for initiation reaction. The spatial separation of individual crystals (as shown by FIG. 4a) also suggests that the polymer chains are located close to the nanocrystal surface.

Example 4: $CsPbBr_3$ Perovskite-Initiated Photo-Polymerisation of Methyl Methacrylate (MMA)

The photo-polymerisation reaction of Example 1 was performed for 12 hours using 1 mL of methyl methacrylate, in place of 1 mL of styrene. The polymerisation product was analysed with NMR with the procedure of Example 2.

Figure 8:
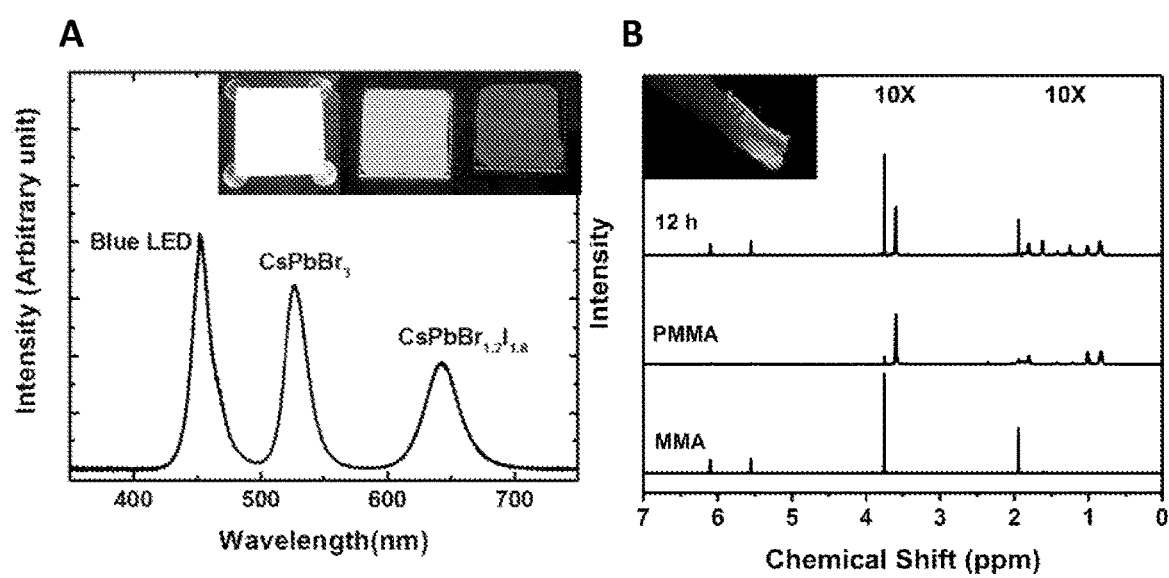
FIG. 8 depicts (A) spectral characteristics and inset images of red-emitting CsPbBr$_{1.2}$I$_{1.8}$ and green-emitting CsPbBr$_3$ perovskite-polystyrene nanocomposite films and their combination with blue LED to form a white light-emitting down-conversion device; and (B) NMR spectra of the reaction products from CsPbBr$_3$ perovskite-initiated photo-polymerisation of MMA to PMMA. Portions representing PMMA protons are multiplied by 10× for clarity. Inset image shows a piece of CsPbBr$_3$ perovskite-PMMA nanocomposite under UV illumination.

FIG. 8b shows the NMR spectra of MMA, PMMA and the polymerisation product, demonstrating a successful photo-polymerisation and a good conversion yield of 25%.

Example 5. $CsPbBr_{1.2}I_{1.8}$ Perovskite-Initiated Photo-Polymerisation of Styrene The photo-polymerisation reaction of Example 1 was performed with a red-emitting perovskite comprising $CsPbBr_{1.2}I_{1.8}$ at a loading concentration of 0.4 w %, in place of $CsPbBr_3$ perovskite nanocrystals (100). The reaction was repeated with a range of reaction times (12-24 hours), and the polymerisation products were characterised with the procedure of Example 2.

$CsPbBr_{1.2}I_{1.8}$ perovskite was prepared by analogy to General procedure 1, where $PbX_2$ is $PbI_2$ (0.052 g) and $PbBr_2$ (0.028 g).

The photo-polymerisation reaction was successful, giving a conversion yield of 5.4% after 20 hours (Table 6). The yield is reasonable, given that the bandgap energy of the mixed bromide-iodide perovskite is smaller than that of bromide perovskite, and hence would be slightly less effective in initiating the reaction.

TABLE 6

Styrene photo-polymerisation using $CsPbBr_{1.2}I_{1.8}$
nanocrystals as a function of reaction time.

| Entry | Reaction time (h) | Conversion (%) | PLQY (%) |
|---|---|---|---|
| 1 | 12 | 3.9 | 11 |
| 2 | 16 | 4.5 | 11 |
| 3 | 20 | 5.4 | 13 |
| 4 | 24 | 6.8 | 10 |

A red-emitting $CsPbBr_{1.2}I_{1.8}$ perovskite-polystyrene nanocomposite film was fabricated by the thin-film preparation procedure in Example 1.

The PL spectrum of the red-emitting film is overlayed with the PL spectra of the green-emitting $CsPbBr_3$ perovskite-polystyrene nanocomposite film of Example 1 and a blue photoexcitation light-emitting diode (FIG. 8a).

The red-emitting film was combined with the green-emitting $CsPbBr_3$ perovskite-polystyrene nanocomposite film of Example 1 and a blue photoexcitation light-emitting diode (LED) to give a white light-emitting device (inset of FIG. 8a). These luminescent nanocomposite films, with their narrow emission line-width, are particularly useful for down-conversion backlight modules in color displays.

Example 6. Preparation of a Cross-Linked Polymer Film Using Poly(Propylene Glycol) Diacrylate (PPG) and a Pre-Polymerised MMA-$CsPbBr_3$ Pervoskite Nanocomposite A perovskite-polymer resin was prepared by mixing poly(propylene glycol) diacrylate (PPG) with a pre-polymerised MMA-$CsPbBr_3$ pervoskite nanocomposite, which was prepared via a perovskite-initiated photo polymerisation. The resin was then applied to a film and cured to give a product which was characterised for its photoluminescence.

Preparation of Pre-Polymerised MMA-$CsPbBr_3$ Pervoskite Nanocomposite $CsPbBr_3$ nanocrystal solution in cyclohexane (500 mL, 5 g/L; prepared via General procedure 2) was added into a 1 L one-neck flask with a magnetic stirring bar. The cyclohexane was completely removed by vacuum, leaving the perovskite nanocrystals solid. 700 mL of MMA was added into the flask at room temperature to give a homogenous dispersion. The mixture was bubbled with Ar for 30 minutes using a Schlenk line. The mixture was then transferred into an Ar-filled glovebox for reaction. The mixture was irradiated by a white LED strip (4.6 W, 1.1 m) for 12 hours to give the pre-polymerised MMA-$CsPbBr_3$ pervoskite nanocomposite.

It is noted that in place of MMA, other monomers such as IBOA, styrene, or a combination of thereof can be used. The mixture can be irradiated for 2-14 hours.

Preparation of 1 L of Perovskite-Polymer Resin

The perovskite-polymer nanocomposite (700 mL, prepared as the above) was added into a 2 L flask and stirred for 10 minutes, followed by the addition of 300 mL of poly(propylene glycol) diacrylate (PPG, average $M_n$~800) and stirred for a further 10 minutes. Finally, 1 wt % (10 g) of dimethoxy-2-phenylacetophenone (DMPA) was added to the mixture and stirred for 60 minutes until the perovskite was completely dispersed in the resin.

Figure 11:
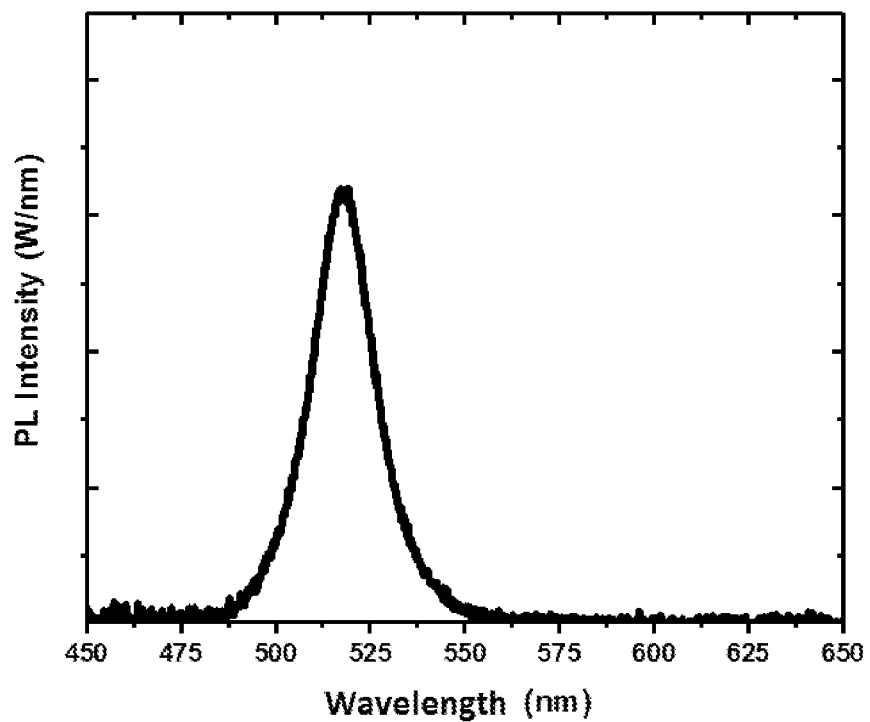
FIGS. 11 to 14 depict PL spectra of films prepared from Examples 6-9, respectively.

1 mL of the perovskite-polymer resin was drop-casted onto a barrier film (WVTR: ×$10^{-2}$) over a length of 10 cm. With the use of a film applicator, the resin was coated to achieve a uniform film with thickness of 100 µm. The film was cured using 365 nm ultraviolet radiation at 2880 J for 192 seconds. FIG. 11 shows the PL spectrum of the cured film ($\lambda_{em}$=518 nm; FWHM=19 nm; and PLQY=80%).

Example 7. Preparation of a Cross-Linked Polymer Film Using Poly(Propylene Glycol) Diacrylate (PPG), Pre-Polymerised MMA and Perovskite A film was prepared from a perovskite-polymer resin comprising of MMA that was pre-polymerised under UV light using a photo-initiator 2,2-Dimethoxy-2-phenylacetophenone (DMPA).

To prepare the perovskite-polymer resin, $CsPbBr_3$ nanocrystal solution in cyclohexane (500 mL, 5 g/L; prepared via General procedure 2) was added into a 2 L two-neck flask with a magnetic stirring bar. The mixture was dried under vacuum. Pre-polymerised MMA (700 mL; prepared via General procedure 4) was added into the flask and stirred for 10 minutes, followed by the addition of 300 mL of poly(propylene glycol) diacrylate (PPG, average $M_n$~800) and stirred for a further 10 minutes. Finally, 1 wt % of DMPA was added to the mixture and stirred for 60 minutes until the perovskite was completely dispersed in the resin.

Figure 12:
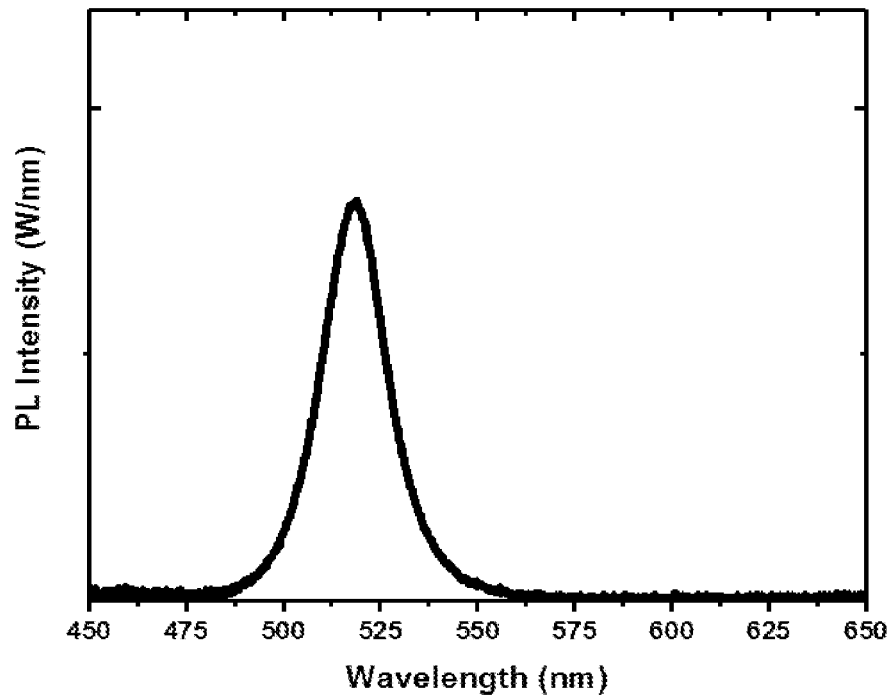

1 mL of the perovskite-polymer resin was drop-casted onto a barrier film (WVTR: ×$10^{-2}$) over a length of 10 cm. With the use of a film applicator, the resin was coated to achieve a uniform film with thickness of 100 µm. The film was cured using 365 nm ultraviolet radiation at 2880 J for 192 seconds. FIG. 12 shows the PL spectrum of the cured film ($\lambda_{em}$=518 nm; FWHM=20 nm; and PLQY=73%).

Example 8. Preparation of a Cross-Linked Polymer Film Using Tricyclo[5.2.1.0$^{2,6}$]Decanedimethanol Diacrylate (DCPDA), Pre-Polymerised Isobornyl Acrylate (IBOA) and Perovskite To prepare the perovskite-polymer resin, $FA_xCs_{1-x}PbBr_3$ nanocrystal solution in cyclohexane (1000 mL, 2.5 g/L; prepared via General procedure 3) was added into a 2 L two-neck flask with a magnetic stirring bar. The mixture was dried under vacuum. Pre-polymerised IBOA (600 mL; prepared via General procedure 4) was added into the glass vial and stirred for 10 minutes. Following which, 200 mL of tricyclo[5.2.1.0$^{2,6}$]decanedimethanol diacrylate (DCPDA) was added and stirred for 10 minutes, and then 200 mL of bisphenol A ethoxylate diacrylate ($M_n$~468) was added and stirred for 10 minutes. Finally, 1 wt % of DMPA was added and stirred for 60 minutes until the perovskite was completely dispersed in the resin.

Figure 13:
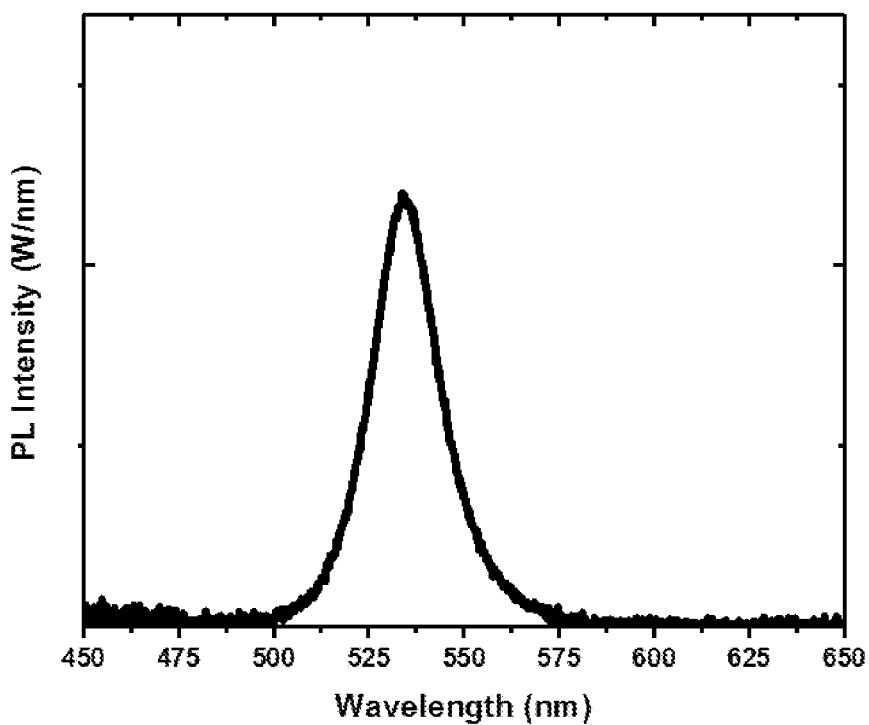

1 mL of the perovskite-polymer resin was drop-casted onto a barrier film (WVTR: ×$10^{-2}$) over a length of 10 cm. With the use of a film applicator, the resin was coated to achieve a uniform film with thickness of 100 µm. The film was cured using 365 nm ultraviolet radiation at 1440 J for 60 seconds. FIG. 13 shows the PL spectrum of the cured film ($\lambda_{em}$=534 nm; FWHM=20 nm; and PLQY=87%).

Example 9. Preparation of a Cross-Linked Polymer Film Using a High-Load of Perovskite (50 Wt %), Pre-Polymerised MMA and Poly(Propylene Glycol) Diacrylate (PPG)

A perovskite-polymer resin was prepared according to Example 7 except that perovskite was present in the resin at 50 wt %. Specifically, $CsPbBr_3$ nanocrystal solution in cyclohexane (500 mL, 5 g/L; prepared via General procedure 2) was dried under vacuum and then transferred to a 20 mL sample vial. Pre-polymerised MMA (3.5 mL; prepared via General procedure 4) was added into the vial and stirred for 10 minutes, followed by the addition of 1.5 mL of PPG and stirred for a further 10 minutes. Finally, 1 wt % of DMPA was added to the mixture and stirred for 60 minutes until the perovskite was completely dispersed in the resin.

Figure 14:
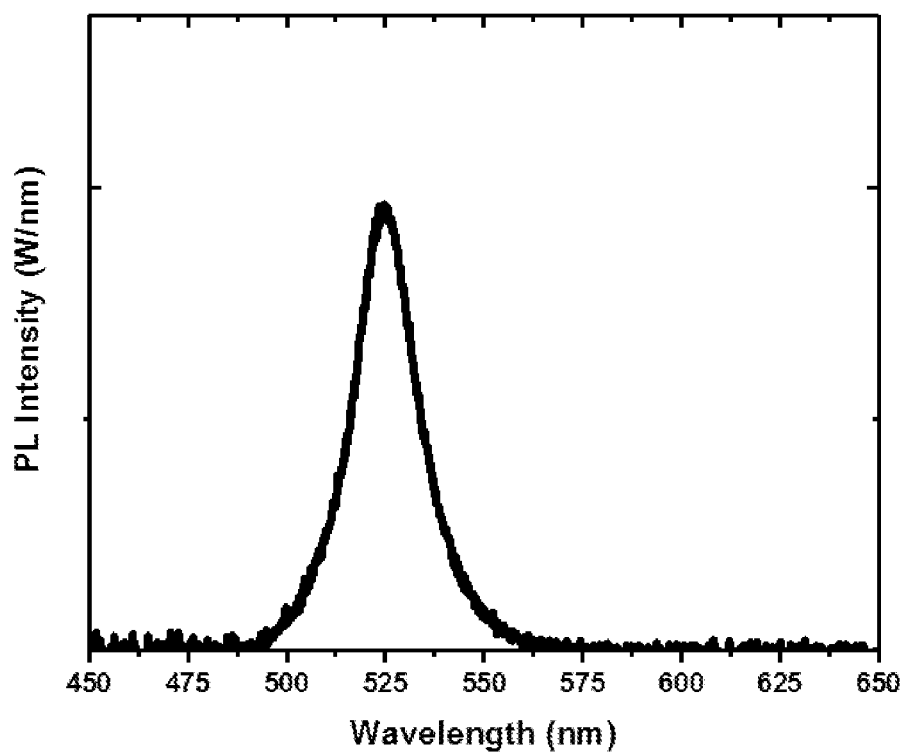

1 mL of the perovskite-polymer resin was drop-casted onto a barrier film (WVTR: ×10$^{-2}$) over a length of 10 cm. With the use of a film applicator, the resin was coated to achieve a uniform film with thickness of 100 µm. The film was cured using 365 nm ultraviolet radiation at 2880 J for 192 seconds. FIG. 14 shows the PL spectrum of the cured film ($\lambda_{em}$=525 nm; FWHM=19 nm; and PLQY=27%).

Example 10. Preparation and Stability of a Cross-Linked Polymer Film Using Pre-Polymerised LMA-CsPbBr$_3$ Pervoskite Nanocomposite Preparation of Pre-Polymerised LMA-CsPbBr$_3$ Pervoskite Nanocomposite CsPbBr$_3$ nanocrystal solution in cyclohexane (500 mL, 5 g/L; prepared via General procedure 2) was added into a 1 L one-neck flask with a magnetic stirring bar. The cyclohexane was completely removed by vacuum, leaving the perovskite nanocrystals solid. 700 mL of LMA was added into the flask at room temperature to give a homogenous dispersion. The mixture was bubbled with Ar for 30 minutes using a Schlenk line. The mixture was then transferred into an Ar-filled glovebox for reaction. The mixture was irradiated by a white LED strip (4.6 W, 1.1 m) for 2-96 hours to give the pre-polymerised LMA perovskite nanocomposite.

Preparation of Perovskite-Polymer Resin (with Photo Pre-Polymerisation)

To prepare the perovskite-polymer resin, the pre-polymerised LMA perovskite nanocomposite (200 mL, prepared as above) was added into a 2 L flask and stirred for 10 minutes, IBOA (100 mL) was added into the flask and stirred for 30 minutes. Following which, 670 mL of DCPDA was added and stirred for 30 minutes. Next, 30 mL of TMPTA was added into the mixture and stirred for another 10 minutes. Finally, 1 wt % of DMPA was added and stirred for 60 minutes until the perovskite was completely dispersed in the resin.

1 mL of the perovskite-polymer resin was drop-casted onto a barrier film (WVTR: ×10$^{-2}$) over a length of 10 cm. With the use of a film applicator, the resin was coated to achieve a uniform film with thickness of 100 µm. The film was cured using 365 nm ultraviolet radiation at 2880 J for 192 seconds.

Preparation of Resin (without Photo Pre-Polymerisation)

CsPbBr$_3$ nanocrystal solution in cyclohexane (400 mL, 5 g/L; prepared via General procedure 2) was added into a 1 L one-neck flask with a magnetic stirring bar. The cyclohexane was completely removed by vacuum, leaving the perovskite nanocrystals solid. 200 mL of LMA was added into the flask and stirred for 30 minutes. Following which, 100 mL of IBOA and 670 mL of DCPDA were added and stirred for 30 minutes. Next, 30 mL of TMPTA was added into the mixture and stirred for another 10 minutes. Finally, 1 wt % of DMPA was added and stirred for 60 minutes until the perovskite was completely dispersed in the resin.

1 mL of the perovskite-polymer resin was drop-casted onto a barrier film (WVTR: ×10$^{-2}$) over a length of 10 cm. With the use of a film applicator, the resin was coated to achieve a uniform film with thickness of 100 µm. The film was cured using 365 nm ultraviolet radiation at 2880 J for 192 seconds.

Stability Tests

High heat test: the samples were subjected using MEMMERT UF75 UNIVERSAL OVEN at 85° C. The samples were prepared as described above.

High heat with high humidity test: the samples were subjected using MEMMERT HCP50 HUMIDITY CHAMBERS 56 L at 60° C./90% RH. The samples were prepared as described above.

High light intensity test: the samples were subjected using a Blue LED setup at 100 mW/cm$^2$, 50° C. The samples were prepared as described above.

Results

Figure 15:
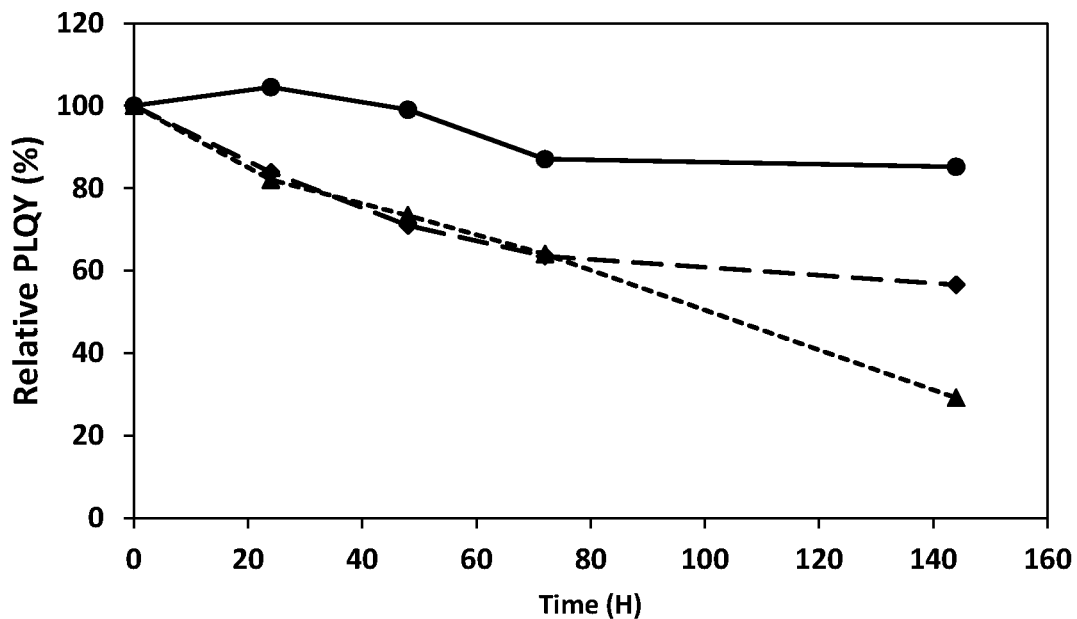
FIG. 15 depicts stability of samples prepared from Example 10 (A) without pre-polymerisation and (B) with pre-polymerisation as a function of time
Figure 15:
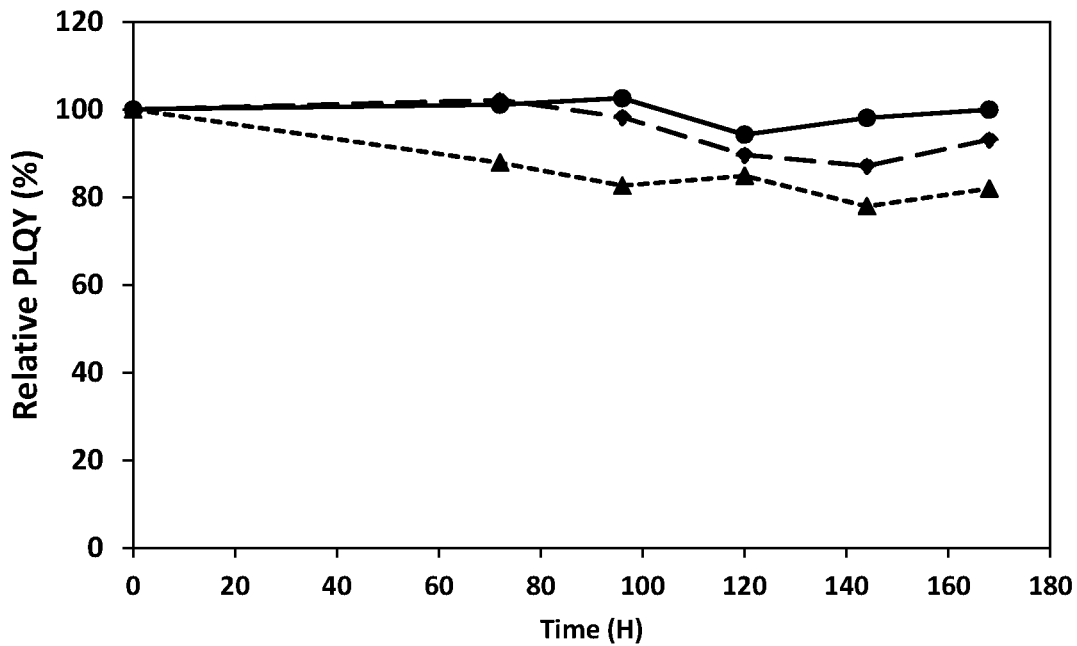

The stability of the samples (with or without photo pre-polymerisation) is summarised in FIG. 15.

The invention claimed is:
1. A polymeric film comprising:
   a crosslinked polymeric matrix material;
   a plurality of perovskite nanocrystals and/or aggregates of perovskite nanocrystals dispersed throughout the polymeric matrix material, the perovskite material of the nanocrystals and/or aggregates having formula I:

$$APbX_3 \qquad I,$$

wherein:
X is a halogen anion selected from one or more of Br, Cl, I;
A is a monovalent cation selected from one or more of Cs, an alkylammonium ion, and a formamidinium ion; and
each perovskite nanocrystal and/or aggregate of perovskite nanocrystals is separated from each other perovskite nanocrystal and/or aggregate of perovskite nanocrystals by an average distance of greater than or equal to 20 nm, wherein
the polymeric matrix material further comprises crosslinking groups.

2. The film according to claim 1, wherein the polymeric matrix material is formed from monomers comprising a vinyl group.

3. The film according to claim 1, wherein the crosslinking groups are derived from a crosslinking agent comprising from two to five vinyl groups.

4. The film according to claim 1, wherein the film comprises:
   from 0.05 to 50 wt % of the plurality of perovskite nanocrystals and/or perovskite aggregates and from 50 to 99.95 wt % of the polymeric matrix material.

5. The film according to claim 1, where one or more of the following apply:
   each nanocrystal has a length of from 2 to 100 nm;
   each aggregate of perovskite nanocrystals has a diameter of from 50 to 5,000 nm; and
   each perovskite nanocrystal and/or aggregate of perovskite nanocrystals is separated from each other perovskite nanocrystal and/or aggregate of perovskite nanocrystals by an average distance of from 20 to 2000 nm.

6. The film according to claim 1 wherein the crosslinked polymeric matrix material comprises a wt:wt ratio of monomeric repeating units to crosslinking units of from 0.02:1 to 50:1.

7. The film according to claim 1, wherein the film comprises:
   a weight to weight ratio of perovskite nanocrystals to polymeric matrix material of from 0.0002:1 to 1:1.

* * * * *